United States Patent
Kim et al.

(10) Patent No.: US 9,412,895 B2
(45) Date of Patent: Aug. 9, 2016

(54) METHOD OF MANUFACTURING PHOTOELECTRIC DEVICE

(75) Inventors: Young-Jin Kim, Yongin-si (KR); Doo-Youl Lee, Yongin-si (KR); Young-Su Kim, Yongin-si (KR); Chan-Bin Mo, Yongin-si (KR); Young-Sang Park, Yongin-si (KR); Jae-Ho Shin, Yongin-si (KR); Sang-Jin Park, Yongin-si (KR); Sang-Won Seo, Yongin-si (KR); Min-Chul Song, Yongin-si (KR); Dong-Seop Kim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 13/612,687

(22) Filed: Sep. 12, 2012

(65) Prior Publication Data

US 2013/0267059 A1    Oct. 10, 2013

Related U.S. Application Data

(60) Provisional application No. 61/620,376, filed on Apr. 4, 2012.

(51) Int. Cl.
*H01L 31/18* (2006.01)
*H01L 31/068* (2012.01)

(52) U.S. Cl.
CPC ........ *H01L 31/1804* (2013.01); *H01L 31/0682* (2013.01); *H01L 31/1864* (2013.01); *Y02E 10/547* (2013.01); *Y02P 70/521* (2015.11)

(58) Field of Classification Search
None
See application file for complete search history.

(56) References Cited

U.S. PATENT DOCUMENTS

| 7,820,460 B2 | 10/2010 | Sullivan et al. |
| 2007/0090394 A1* | 4/2007 | Bui et al. ............ 257/127 |
| 2009/0227062 A1* | 9/2009 | Sullivan et al. ........ 438/61 |
| 2009/0227094 A1 | 9/2009 | Bateman et al. |

(Continued)

FOREIGN PATENT DOCUMENTS

| JP | 3965605 | 8/2007 |
| JP | 2009-76546 A | 4/2009 |

(Continued)

OTHER PUBLICATIONS

Patent Abstracts of Japan Publication No. 09-245722 dated Sep. 19, 1997, which corresponds to JP 3965605, and Machine English Translation, 24 pages.

(Continued)

*Primary Examiner* — Charles Garber
*Assistant Examiner* — Stanetta Isaac
(74) *Attorney, Agent, or Firm* — Lewis Roca Rothgerber Christie LLP

(57) ABSTRACT

A method of manufacturing a photoelectric device, the method including: forming a first semiconductor layer on a semiconductor substrate through a first ion implantation; forming a second semiconductor layer having an inverted conductive type on a part of the first semiconductor layer through a second ion implantation; and performing thermal processing to restore lattice damage of the semiconductor substrate and activate a dopant into which ion implanted. According to one or more embodiments of the present invention, a photoelectric device having a reduction in the number of processes for manufacturing the photoelectric device and improved output characteristics is provided.

21 Claims, 19 Drawing Sheets

(56) References Cited

U.S. PATENT DOCUMENTS

| | | |
|---|---|---|
| 2009/0227095 A1 | 9/2009 | Bateman et al. |
| 2009/0308440 A1* | 12/2009 | Adibi et al. .................. 136/255 |
| 2009/0309039 A1 | 12/2009 | Adibi et al. |
| 2010/0035421 A1* | 2/2010 | Denison et al. ............... 438/514 |
| 2010/0190286 A1 | 7/2010 | Kohira et al. |
| 2010/0279454 A1* | 11/2010 | Eickelmann et al. ........... 438/72 |
| 2010/0304522 A1* | 12/2010 | Rana et al. ..................... 438/71 |
| 2011/0012222 A1* | 1/2011 | Cho ..................... H01L 21/268 257/461 |
| 2011/0139230 A1* | 6/2011 | Rohatgi et al. ................ 136/255 |
| 2011/0183458 A1* | 7/2011 | Weidman et al. .............. 438/71 |
| 2011/0201188 A1 | 8/2011 | Gupta et al. |
| 2012/0167978 A1 | 7/2012 | Shin et al. |

FOREIGN PATENT DOCUMENTS

| | | |
|---|---|---|
| JP | 2011-524639 A | 9/2011 |
| KR | 10-2010-0096819 A | 9/2010 |
| KR | 10-2011-0027388 A | 3/2011 |
| KR | 10-2012-0078904 A | 7/2012 |
| WO | WO 2013/166171 A1 | 11/2013 |

OTHER PUBLICATIONS

Korean Notice of Allowance dated Apr. 15, 2014 issued by the KPO for corresponding Korean Patent Application No. 10-2012-0090095, 6 pages.

EPO Search Report dated Dec. 17, 2014, for corresponding European Patent application 12191136.6, (9 pages).

\* cited by examiner

METHOD OF MANUFACTURING PHOTOELECTRIC DEVICE

CROSS-REFERENCE TO RELATED APPLICATION

This application claims priority to and the benefit of U.S. Provisional Application No. 61/620,376, filed on Apr. 4, 2012, in the USPTO, the disclosure of which is incorporated herein in its entirety by reference

BACKGROUND

1. Field

One or more embodiments of the present invention relate to a method of manufacturing a photoelectric device.

2. Description of Related Art

Currently, due to problems such as exhaustion of energy resources and environmental pollution of the earth, the development of clean energy sources has been accelerated. As a form of clean energy, photovoltaic energy generated using solar cells is an energy that is converted from sunlight, and thus, is regarded as a promising new energy source.

However, costs associated with the industrial manufacture of solar cells are high in comparison to costs associated with the generation of thermal energy. Furthermore, increasing power generation efficiency of solar cells would allow solar cells to have broad industrial applicability. Accordingly, to mass produce high-efficiency solar cells, manufacturing cost reduction and process simplification are desired.

SUMMARY

One or more embodiments of the present invention include a photoelectric device having a reduction in the number of processes for manufacturing the photoelectric device and improved output characteristics.

One or more embodiments of the present invention include a method of manufacturing a photoelectric device, the method including forming a first semiconductor layer having a first conductive type at a semiconductor substrate through a first ion implantation of a first dopant, forming a second semiconductor layer having a second conductive type that is different from the first conductive type at a part of the first semiconductor layer through a second ion implantation of a second dopant, and performing thermal processing of the semiconductor substrate to activate at least one of the first and second dopants.

The first dopant having the first conductive type that is different from that of the semiconductor substrate may be implanted during the first ion implantation, and the second dopant having the second conductive type that is the same as that of the semiconductor substrate may be implanted during the second ion implantation.

Forming the second semiconductor layer may include implanting the second dopant of the second semiconductor layer in the part of the first semiconductor layer corresponding to an opening pattern of a mask.

The method may further include implanting the second dopant of the second ion implantation deeper than the first dopant of the first ion implantation.

An ion dose corresponding to the second ion implantation may be higher than that corresponding to the first ion implantation.

The performing of the thermal processing may include exposing the semiconductor substrate to a temperature of about 950° C. to about 1100° C. in an atmosphere including at least one of nitrogen or oxygen.

A junction depth of the second semiconductor layer may be deeper than that of the first semiconductor layer after the thermal processing has been performed.

A surface concentration of dopants of the second semiconductor layer may be higher than that of the first semiconductor layer after the first and second ion implantations have been performed.

The method may further include forming an anti-diffusion layer on the first and second semiconductor layers before the thermal processing is performed, and after the first ion implantation of the first dopant and the second ion implantation of the second dopant.

Forming the anti-diffusion layer may include forming undoped silicate glass (USG).

The method may further include forming a third semiconductor layer at a second surface of the semiconductor substrate through a third ion implantation, wherein the first and second ion implantations are performed at a first surface of the semiconductor substrate.

The method may further include passivating the first and second surfaces of the semiconductor substrate after the third semiconductor layer has been formed.

The passivating may include an oxidation process for forming a silicon oxide layer at the first and second surfaces of the semiconductor substrate.

One or more embodiments of the present invention include a method of manufacturing a photoelectric device, the method including forming a first semiconductor layer at a first surface of a semiconductor substrate through a first ion implantation, forming a second semiconductor layer having a conductive type that is different from that of the first semiconductor layer at a part of the first semiconductor layer through a second ion implantation, forming a third semiconductor layer at a second surface of the semiconductor substrate that is opposite to the first surface through a third ion implantation, and performing thermal processing to correct lattice damage of the semiconductor substrate, to activate an implanted dopant, and to passivate the first and second surfaces of the semiconductor substrate.

The performing of the thermal processing may include forming a silicon oxide layer on the first and second surfaces of the semiconductor substrate.

The performing of the thermal processing may include performing a first processing and a second processing in a reactor containing the semiconductor substrate.

The first processing may include exposing the semiconductor substrate to a temperature of about 950° C. to about 1100° C., at a pressure of the reactor below about 0.5 torr in a nitrogen atmosphere for about 10 minutes to about 100 minutes, and the second processing may include forming an oxygen radical by supplying hydrogen and oxygen to the reactor together at a temperature of about 800° C. to about 1100° C. at a pressure of the reactor below about 0.5 torr.

The first processing may include exposing the semiconductor substrate to a temperature of about 950° C. to about 1100° C., at a pressure of the reactor above about 700 torr in a nitrogen atmosphere for about 10 minutes to about 100 minutes, and the second processing may include exposing the semiconductor substrate to a temperature of about 800° C. to about 1100° C. in an oxygen atmosphere at a pressure of the reactor above about 700 torr.

The second processing may further include supplying a reaction gas containing at least one of hydrogen chloride or hydrogen to the reactor.

The method may further include forming an anti-diffusion layer at the first surface of the semiconductor substrate after forming the first semiconductor layer and the second semiconductor layer, and before performing thermal processing.

Forming the anti-diffusion layer may include forming undoped silicate glass (USG).

As described above, according to the one or more of the above embodiments of the present invention, a first semiconductor layer is formed by applying a first ion implantation throughout a front surface of a semiconductor substrate, and a counter-doped second semiconductor layer is formed by overlappingly applying the first ion implantation and a second ion implantation to a partial selected region. Accordingly, the number of processes for manufacturing a photoelectric device is reduced, which reduces a rate of occurrence of a process defect, thereby improving product yield and reducing manufacturing cost.

Furthermore, the first and second semiconductor layers are formed by implanting ions, and thus, an ion dose implanted into the semiconductor substrate may be easily controlled, and by varying an amount of energy used for accelerating a corresponding ion beam during the ion implantation, a doping profile and a junction depth are controlled, thereby reducing junction leakage current, enhancing an open circuit voltage, and ultimately enhancing photoelectric conversion efficiency.

DETAILED DESCRIPTION

Figure 1A:
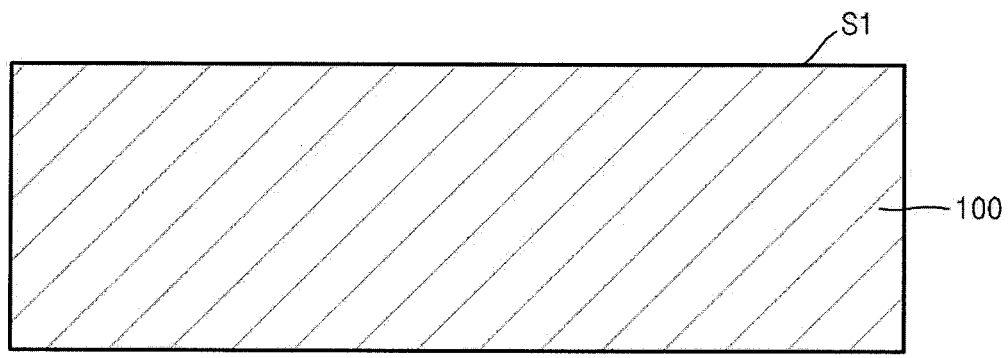
FIGS. 1A through 1M are schematic sequential cross-sectional views for describing a method of manufacturing a photoelectric device, according to an embodiment of the present invention.

Reference will now be made in detail to embodiments, examples of which are illustrated in the accompanying drawings, wherein like reference numerals refer to like elements throughout.

FIGS. 1A through 1M are schematic sequential cross-sectional views for describing a method of manufacturing a photoelectric device, according to an embodiment of the present invention.

Referring to FIG. 1A, a semiconductor substrate 100 is prepared. The semiconductor substrate 100 may be prepared as an n-type or p-type crystalline silicon wafer. For example, to remove a sawing damage that occurs when the semiconductor substrate 100 is manufactured, and/or to remove physical and chemical impurities attached to the semiconductor substrate 100, a cleaning process of applying an alkaline solution such as, for example, KOH or NaOH may be applied.

Figure 1B:
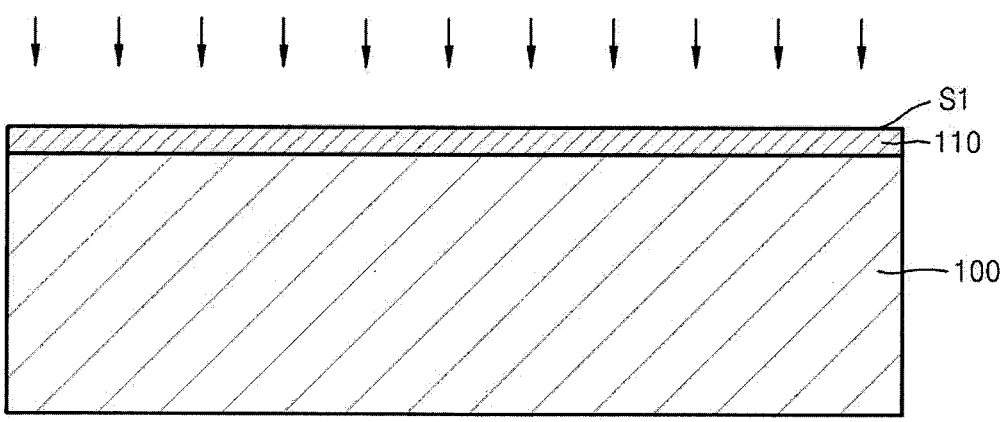

Referring to FIG. 1B, a first semiconductor layer 110 is formed on the semiconductor substrate 100 by using first ion implantation. The first ion implantation may be performed over substantially an entire (e.g., the overall of a) first surface S1 of the semiconductor substrate 100. The first semiconductor layer 110 may be formed in a substantially entire region of the semiconductor substrate 100.

The first semiconductor layer 110 may be doped in a conductive type that is inverse to that of the semiconductor substrate 100 to thereby form a p-n junction. According to an embodiment of the present invention, the first semiconductor layer 110 may be formed as a doping layer having a conductive type that is inverse to that of the semiconductor substrate 100 by implanting a p-type dopant into an n-type semiconductor substrate 100, or by implanting an n-type dopant into a p-type semiconductor substrate 100. The first semiconductor layer 100 may form an emitter that collects minority carriers generated from the semiconductor substrate 100.

For example, during the first ion implantation, a projection range, which is a linear distance of a range of the dopant from the surface of the semiconductor substrate 100, may be set from about 5 nm to about 300 nm, and the implanted ion dose may be set from about $10^{14}$ atoms/cm$^2$ to about $10^{16}$ atoms/cm$^2$.

Figure 1C:
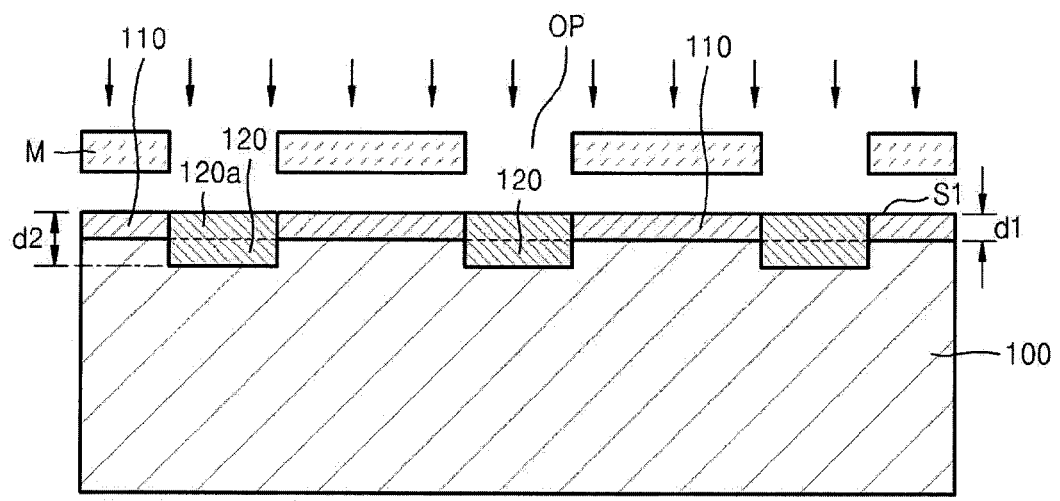

Referring to FIG. 1C, second semiconductor layers (e.g., a second semiconductor layer having areas of separation) 120 are formed in the semiconductor substrate 100 by using second ion implantation. The second ion implantation may be performed by selectively implanting ions into a corresponding region of an opening pattern OP using a mask M, in which the opening pattern OP is formed, and thus the second semiconductor layers 120 are formed in a part of the semiconductor substrate 100. Although the mask M of the present embodiment is a shadow mask, the mask(s) of other embodiments of the present invention may be any structure having openings for a patterned ion implantation. Counter doping, which implants a dopant having a conductive type inverse to that of the first semiconductor layer 110, is performed during the second ion implantation, and thus the second semiconductor layers 120 having a conductive type that is inverse to that of the first semiconductor layer 110 may be formed.

For example, the second semiconductor layers 120 may be doped to have the same conductive type as that of the semiconductor substrate 100, and may be doped at a higher concentration than that of the semiconductor substrate 100 (e.g., the rate at which the dopant of the second semiconductor layers 120 is ejected from the machinery performing the doping may be greater than that of the dopant of the semiconductor substrate 100, or the final concentration of the dopant per unit volume or unit area at the surface of the second semiconductor layers 120 may be greater than that of the dopant at the surface of the semiconductor substrate 100), and thus a high-low junction (h-l junction, or high concentration-low concentration junction) may be formed. The second semiconductor layers 120 may be formed by implanting the n-type dopant into the n-type semiconductor substrate 100, or by implanting the p-type dopant into the p-type semiconductor substrate 100. The second semiconductor layers 120 may form bases that collect a plurality of carriers generated from the semiconductor substrate 100. The second semiconductor layers 120 may form a back surface field (BSF) to reduce a surface recombination loss in the first surface S1 (i.e., a rear surface) of the semiconductor substrate 100.

For example, during the second ion implantation, the projection range, which is the range of the dopant from the surface of the semiconductor substrate 100, may be set from about 5 nm to about 300 nm, and the implanted ion dose may be set from about $10^{14}$ atoms/cm² to about $10^{16}$ atoms/cm².

For example, the projection range of the second ion implantation may be set greater than that of the first ion implantation. The projection range of the second ion implantation may relatively increase in such a way that a h-l junction depth d2 by the second ion implantation is deeper than a h-l junction depth d1 by the first ion implantation. The projection range may vary with respect to an amount of energy used to accelerate the corresponding ion beam(s).

For example, the ion dose (e.g., the rate at which ions are delivered toward the substrate 100) of the second ion implantation may be set higher than that of the first ion implantation preceding the second ion implantation. To form the second semiconductor layers 120 having the inverted conductive type (e.g., inverted from the conductive type of the first semiconductor layer 110) in a partial region of the semiconductor substrate 100 by performing the first and second ion implantations overlappingly, the ion dose of the second ion implantation may increase.

The counter doping by the second ion implantation will now be described in more detail with reference to FIGS. 1B and 1C. Referring to FIG. 1B, the first semiconductor layer 110 is formed over a substantial entirety of the first surface S1 of the semiconductor substrate 100 by performing the first ion implantation, and thereafter the second ion implantation is performed. During the second ion implantation, the mask M having the opening pattern OP is located on the first semiconductor layer 110, and a dopant is selectively implanted into a region corresponding to the opening pattern OP. In this regard, the dopant having a conductive type inverse to that of the first semiconductor layer 110 is implanted, and thus the second semiconductor layers 120 having such an inverted conductive type may be formed (counter doping).

For example, the p-n junction is formed in a contact region between the first semiconductor layer 110 and bulk regions of the semiconductor substrate 100, and the h-l junction (high concentration-low concentration junction) is formed in a contact region between the second semiconductor layers 120 and bulk regions of the semiconductor substrate 100. In this regard, the h-l junction is formed at a location that is deeper than the p-n junction, that is, a location relatively distant from the first surface S1 of the semiconductor substrate 100, and the junction depth d2 of the h-l junction is greater than the junction depth d1 of the p-n junction (d2>d1). Contrastingly, if the junction depth d2 of the h-l junction is shallower than the junction depth d1 of the p-n junction, i.e. d2<d2, since the second semiconductor layers 120 formed in the selective region of the semiconductor substrate 100 are surrounded by the first semiconductor layer 110 formed over the semiconductor substrate 100, the carriers generated in the semiconductor substrate 100 might not move to the second semiconductor layers 120 due to an electric potential barrier of the first semiconductor layer 110, which deteriorates collection efficiency of carriers.

Although FIG. 1C shows that the junction depth d1 of the p-n junction is approximately equal to a thickness of the first semiconductor layer 110, and the junction depth d2 of the h-l junction is approximately equal to a thickness(es) of the second semiconductor layers 120, FIG. 1C is merely for easily understanding a relative relationship of locations of the junction depth d1 of the p-n junction and the junction depth d2 of the h-l junction, and does not necessarily show an actual location or relationship of the p-n junction or the h-l junction. Although the p-n junction or the h-l junction may be formed around a boundary contacting the first and second semiconductor layers 110 and 120 and bulk regions of the semiconductor substrate 100, the p-n junction or the h-l junction may be formed inside the first and second semiconductor layers 110 and 120.

The junction depth d1 of the p-n junction and the junction depth d2 of the h-l junction may vary with respect to the amount of energy that accelerates the ion beam during the first and second ion implantations. For example, if an ion beam having a relatively high energy collides with the semiconductor substrate 100, the junction depth d1 and the junction depth d2 increase, whereas an ion beam having a relatively low energy colliding with the semiconductor substrate 100 results in the junction depth d1 and the junction depth d2 decreasing.

The junction depth d1 of the p-n junction or the junction depth d2 of the h-l junction described above does not indicate a status after the first and second ion implantations, but may indicate a status after thermal processing is performed to restore (e.g., correct) lattice damage due to the first and second ion implantations and to activate implanted dopants. That is, the junction depth d1 of the p-n junction or the junction depth d2 of the h-l junction may correspond to a final product status after a general process is completely finished.

Meanwhile, the surfaces of the second semiconductor layers 120 include counter doping portions 120a that are doped in the same conductive type as that of the first semiconductor layer 110 after the first ion implantation, and are inverted in their conductive type by implanting a counter conductive type dopant during the second ion implantation.

The surfaces of the second semiconductor layers 120, for example, the counter doping portions 120a, may be doped at a higher concentration than that of the first semiconductor layer 110. That is, to offset the p-type or n-type dopant implanted in the first semiconductor layer 110 during the first ion implantation, and furthermore to form the second semiconductor layers 120 having the inverted n-type or p-type conductive type, a greater amount of dopants may be implanted in the second semiconductor layers 120 than in the first semiconductor layer 110. For example, a doping concentration at the surfaces of the second semiconductor layers 120 may be higher than that of the surface of the first semiconductor layer 110. In this regard, the doping concentration does not indicate a status after the first and second ion implantations, but may indicate a status after thermal processing is performed to restore lattice damage due to the first and second ion implantations and to activate implanted dopants. That is, the doping concentration may correspond to a final product status after a general process is completely finished.

Figure 2A:
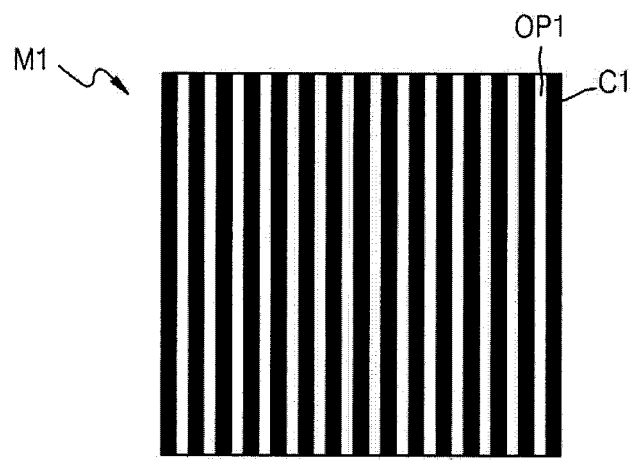
FIGS. 2A and 2B are exemplary diagrams of opening patterns of masks applicable to the second ion implantation, according to embodiments of the present invention.
Figure 2B:
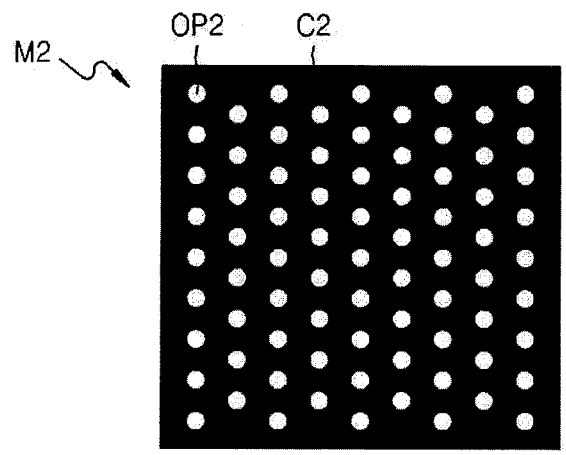

FIGS. 2A and 2B are exemplary diagrams of opening patterns OP1, OP2 of masks M1, M2 (respectively) applicable to a second ion implantation. During the second ion implantation, the second semiconductor layers 120 are formed by selectively implanting an n-type or p-type dopant into regions corresponding to the opening patterns OP1, OP2 of the masks M1, M2.

If the mask M1 of FIG. 2A is applied, the first and second semiconductor layers 110 and 120 may be alternately formed in stripe patterns. For example, the opening pattern OP1 of the mask M1 forms the second semiconductor layer 120 that is counter-doped from the first semiconductor layer 110 and that is inverted in its conductive type, and a closed part C1 of the mask M1 forms the first semiconductor layer 110 that remains unchanged.

If the mask M2 of FIG. 2B is applied, the second semiconductor layers 120 may be formed in an isolation shape of a dot type or island type, and the first semiconductor layer 110 may surround the second semiconductor layers 120 in the isolation shape. For example, the circular opening pattern OP2, of the mask M2 forms the second semiconductor layers 120 that is counter-doped from the first semiconductor layer 110 and that is inverted in its conductive type, and a closed part C2 of the mask M2 forms the first semiconductor layer 110 that remains unchanged.

The circular second semiconductor layers 120 of the present embodiment may be formed by applying the mask M2 of FIG. 2B. As described above, areas of the first and second semiconductor layers 110 and 120 are differently designed, thereby enhancing collection efficiency of carriers. That is, the first semiconductor layer 110 that collects minority carriers is relatively widely formed, thereby enhancing collection efficiency of carriers.

The mask M2 of FIG. 2B is an example corresponding to forming the second semiconductor layers 120 in the isolation shape. For example, the opening pattern OP2 of the mask M2 may be an oval or polygonal shape, instead of a circular shape.

For example, the masks M1, M2 may be formed of a carbon based graphite material. In this regard, the graphite material may include a material for improving physical and chemical stability. Further, the masks M1, M2 may include a silicon carbide SiC or ceramic material. Such a selection of the material of the masks M1, M2 is to consider processability and material expense, and secure strength above an optimum level.

Figure 3:
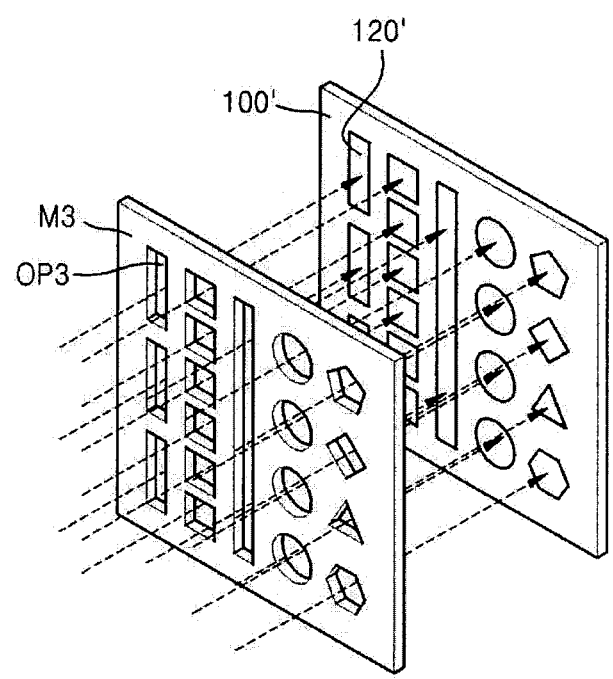
FIG. 3 is a schematic perspective view of second ion implantation, in which a second semiconductor layer of various shapes is formed on a semiconductor substrate according to an opening pattern of a mask, according to an embodiment of the present invention.

FIG. 3 is a schematic perspective view of second ion implantation, in which second semiconductor layers 120' of various shapes are formed on a semiconductor substrate 100' according to opening patterns OP3 of a mask M3.

Figure 1D:
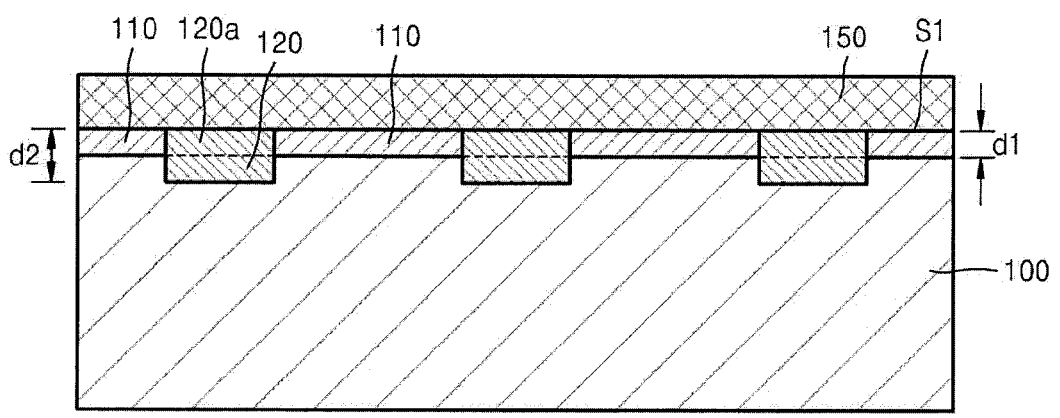

Referring to FIG. 1D, an anti-diffusion layer 150 is formed on the first surface S1 of the semiconductor substrate 100 after first and second ion implantations are performed. The anti-diffusion layer 150 prevents or reduces a dopant(s) implanted in the semiconductor substrate 100 from diffusing outside of the substrate 100 during a thermal processing operation, which will be described later. To reduce the likelihood of, or to prevent, the dopant having an increased diffusion speed in a high temperature environment for thermal processing from diffusing to outside of the semiconductor substrate 100, the anti-diffusion layer 150 is formed on the first surface S1 of the semiconductor substrate 100 at which the first and second semiconductor layers 110 and 120 are formed.

Further, as will be described later, the anti-diffusion layer 150 may serve as an anti-etching layer when a second surface of the semiconductor substrate 100 is textured, and may function to protect the first and second semiconductor layers 110 and 120 from a texturing etchant.

Silicate glass may be applied as the anti-diffusion layer 150. More specifically, undoped silicate glass (USG) that does not include a p-type or n-type dopant may be applied as the anti-diffusion layer 150. For example, the anti-diffusion layer 150 may be formed using chemical vapor deposition (CVD) using tetraethyl orthosilicate (TEOS) or silane (SiH4), and may have a thickness of about 50 nm to about 300 nm.

Thereafter, thermal processing is performed to restore lattice damage of the semiconductor substrate 100, which may be due to ion shocks of the first and second ion implantations, and to activate implanted dopants. For example, the implanted dopants are mostly located in interstitial site other than lattice sites, and thus are not activated, and thus thermal processing may be performed to activate the implanted dopants.

Thermal processing is performed at a high temperature that is lower than a fusion temperature and high enough to restore the lattice damage and to activate the implanted dopants, for example, at a temperature lower than about 950° C. to about 1100° C. in a nitrogen or oxygen atmosphere.

After thermal processing is performed, a surface concentration of the first semiconductor layer 110 may have a range from about $10^{18}$ atoms/cc to about $10^{20}$ atoms/cc, and the junction depth d1 of a p-n junction by the first semiconductor layer 110 may have a range from about 0.5 μm to about 1.5 μm. A surface concentration of the second semiconductor layer 120 may have a range from about $5 \times 10^{18}$ atoms/cc to about $10^{21}$ atoms/cc, and the junction depth d2 of a h-l junction by the second semiconductor layer 120 may have a range from about 0.7 μm to about 2.0 μm. The surface concentrations of the first and second semiconductor layers 110 and 120, and the junction depths d1 and d2, may be designed within the ranges stated above, for example, to form an ohmic contact with a metal electrode and to reduce recombination loss of carriers.

The surface of the second semiconductor layer 120 may be doped at a higher concentration than that of the first semiconductor layer 110. To overlappingly apply the first and second ion implantations to the surface of the second semiconductor layer 120 and to invert a conductive type thereof, the surface concentration of the second semiconductor layer 120 may be relatively higher than that of the first semiconductor layer 110, and a p-type or n-type dopant implanted during the second ion implantation may offset a p-type or n-type dopant implanted during the first ion implantation and may invert the conductive type of the second semiconductor layer 120.

The h-l junction by the second semiconductor layer 120 may be formed at a location deeper than the p-n junction by the first semiconductor layer 110, that is, at a location relatively distant from the first surface S1 of the semiconductor substrate 100. That is, the junction depth d2 of the h-l junction by the second semiconductor layer 120 may be greater than the junction depth d1 of the p-n junction by the first semiconductor layer 110 (d2>d1), and thus the second semiconductor layer 120 and bulk regions of the semiconductor substrate 110 may form an electrical contact, and a plurality of carriers generated in the semiconductor substrate 100 is not blocked by an electric potential barrier of the first semiconductor layer 110, but is instead collected in the second semiconductor layer 120.

Figure 1E:
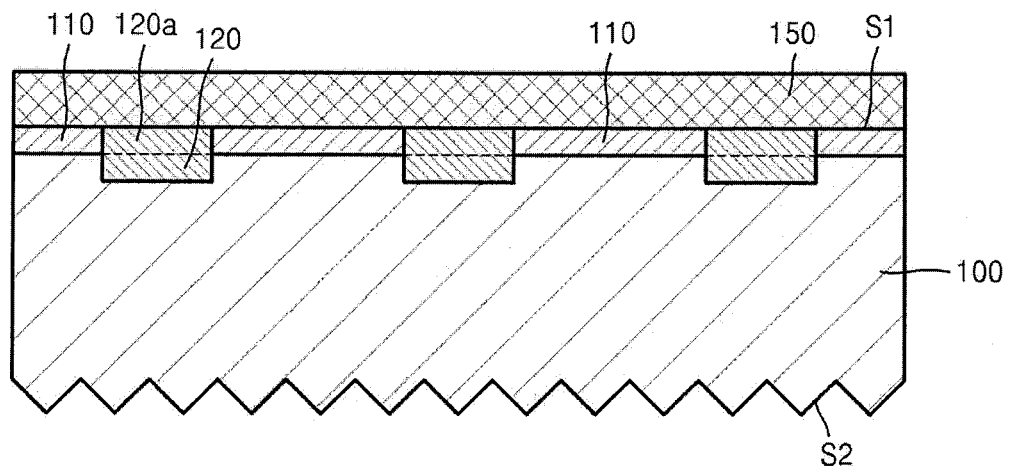

Referring to FIG. 1E, texturing is performed on a second surface S2 of the semiconductor substrate 100. For example, an etchant including isoprophyl alcohol (IPA) and adhesive added to an aqueous solution, such as KOH or NaOH, are applied to the semiconductor substrate 100 during texturing. In this regard, a texture structure of a pyramid pattern may be formed in the second surface S2 of the semiconductor substrate 100 according to anisotropic etching characteristics with respect to a crystalline direction of single crystal silicon. The texture structure reduces reflectivity of incident light, and thus light collection efficiency increases, and an increased amount of the incident light is absorbed into the semiconductor substrate 100. Meanwhile, the first surface S1 of the semiconductor substrate 100 covered by the anti-diffusion layer 150 may be protected instead of etched.

Figure 1F:
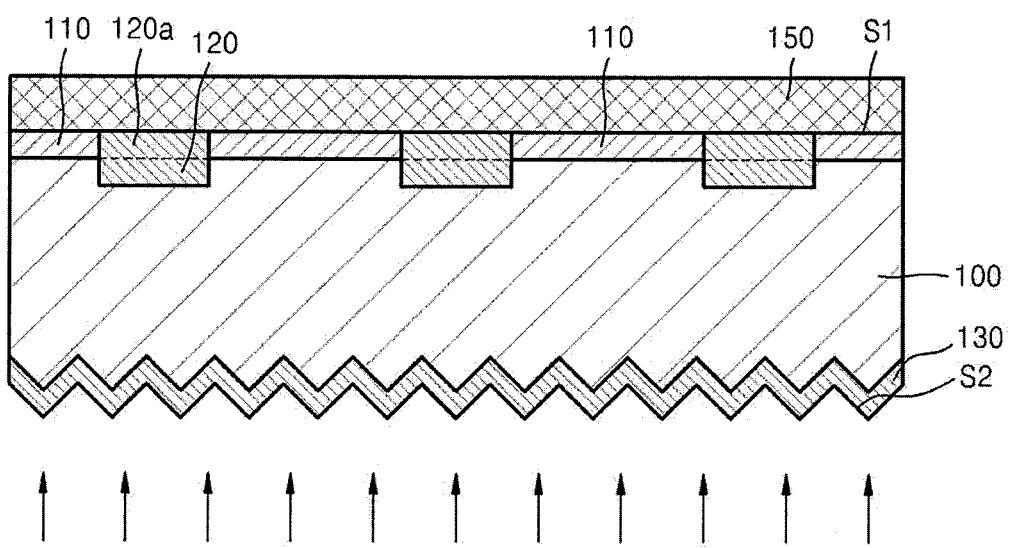

Referring to FIG. 1F, third ion implantation is used to form a front surface field (FSF) (e.g., a third semiconductor layer) 130 on the second surface S2 of the semiconductor substrate 100. The third ion implantation may be over a substantial entirety of the second surface S2 of the semiconductor substrate 100, causing the FSF 130 to be formed at a substantial entirety of the second surface S2.

The FSF 130 may be doped to have the same conductive type as that of the semiconductor substrate 100, but at a higher concentration than that of the semiconductor substrate 100, to form the h-l junction (high-low junction). The FSF 130 may be formed by implanting an n-type dopant into the n-type semiconductor substrate 100, or by implanting a p-type dopant into the p-type semiconductor substrate 100. For example, the FSF 130 may prevent or reduce the likelihood of minority carriers moving to the second surface S2 and recombining, and may also reduce surface recombination loss in the second surface S2, by forming a high concentration doping layer in the second surface S2 of the semiconductor substrate 100.

For example, during the third ion implantation, a projection range of a dopant from the surface of the semiconductor substrate 100 may be set from about 5 nm to about 500 nm, and the implanted ion dose may be set from about $10^{13}$ atoms/cm² to about $10^{15}$ atoms/cm².

Figure 1G:
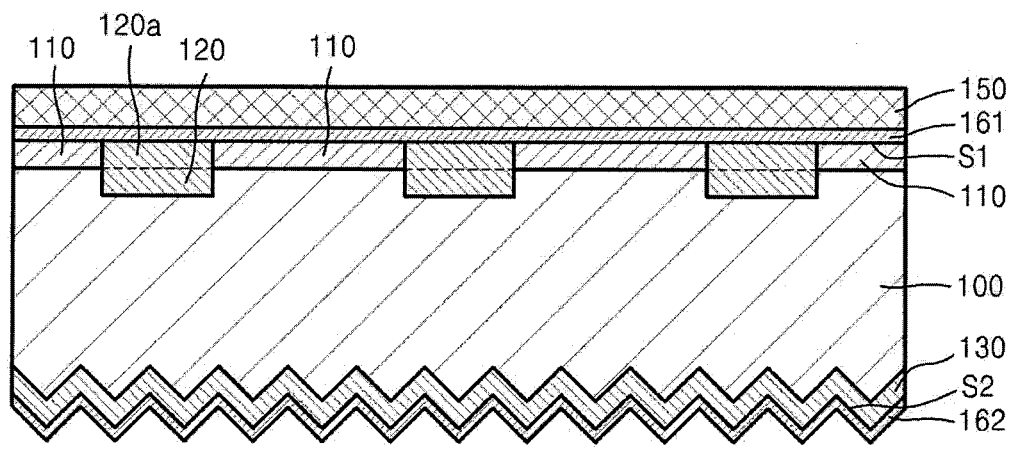

Referring to FIG. 1G, passivation layers 161 and 162 are formed in the first and second surfaces S1 and S2 of the semiconductor substrate 100. For example, a process of forming the passivation layers 161 and 162 may include an oxide process, and silicon oxide layers SiOx may be formed as the passivation layers 161 and 162. For example, the process of forming the passivation layers 161 and 162 may be performed on the processing conditions i) and ii) described below.

Oxygen radicals are formed by supplying hydrogen and oxygen together at a high temperature in the range of about 800° C. to about 1100° C., and at a low reactor pressure below about 0.5 torr.

The process is performed in an oxygen atmosphere or a reaction gas containing hydrogen chloride or hydrogen is supplied in the oxygen atmosphere at a high temperature of about 800° C. to about 1100° C., and at a high reactor pressure above about 700 torr.

During the process of forming the passivation layers 161 and 162, oxygen contained in the reactor reacts silicon of the semiconductor substrate 100 through the anti-diffusion layer 150 on the first surface S1 of the semiconductor substrate 100, and accordingly, the passivation layer 161 grows in the first surface S1 of the semiconductor substrate 100. Oxygen contained in the reactor also reacts silicon of the semiconductor substrate 100 on the second surface S2 of the semiconductor substrate 100, and accordingly, the passivation layer 162 grows in the second surface S2 of the semiconductor substrate 100.

The process of forming the passivation layers 161 and 162 is performed in an environment at a temperature higher than about 800° C., and thus thermal processing may be concurrently (e.g., simultaneously) performed to restore lattice damage due to ion shock during the third ion implantation and to activate implanted dopants, allowing both effects of passivation and thermal processing to be obtained through one process.

After the process of forming the passivation layers 161 and 162 is performed, the surface concentration of the FSF 130 may have a range of about $10^{18}$ atoms/cc to about $5 \times 10^{19}$ atoms/cc, and a junction depth of the h-l junction (high-low junction) by the FSF 130 may have a range of about 0.3 μm to about 1.5 μm.

Figure 1H:
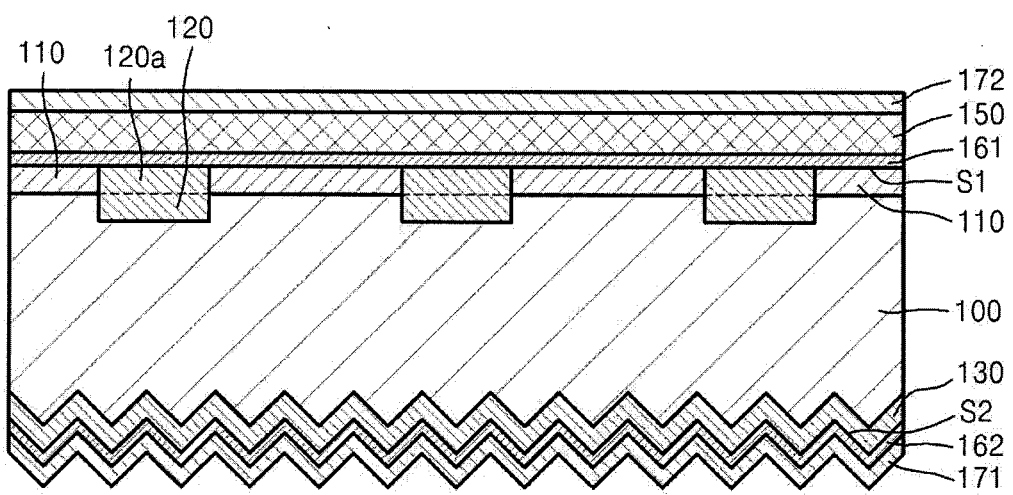
Figure 1I:
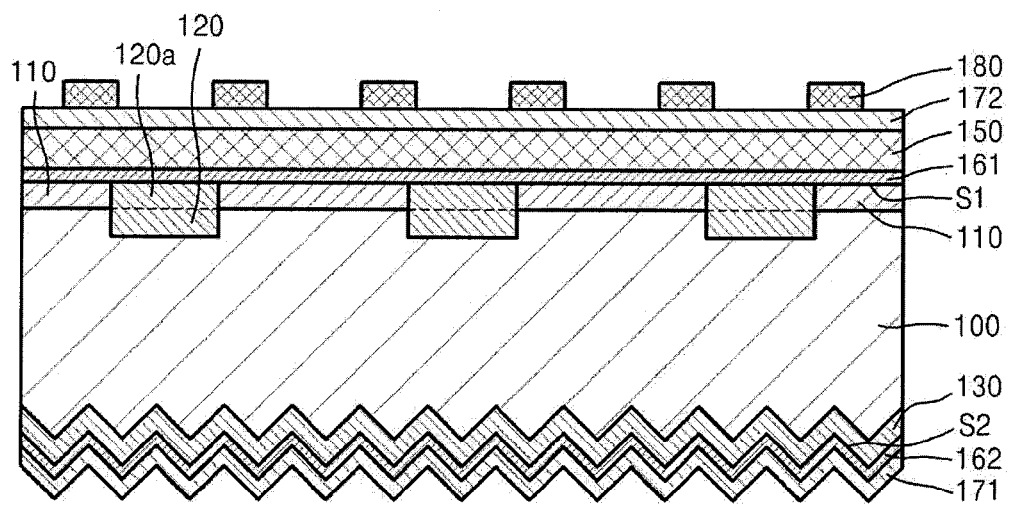

Referring to FIG. 1H, an antireflective layer 171 is formed on the second surface S2 of the semiconductor surface 100, and, for example, may be formed as a silicon nitride layer (SiNx). The antireflective layer 171 may be formed by using a CVD process, and inhibits incident light from being reflected to promote absorption of light of the semiconductor substrate 100, thereby increasing collection efficiency of light.

Meanwhile, the antireflective layer 171 is formed on the second surface S2 of the semiconductor substrate 100, while concurrently (e.g., simultaneously) an additional passivation layer 172 may be formed on the first surface S1. The additional passivation layer 172 may reduce surface recombination loss of carriers in the first surface S1 of the semiconductor substrate 100, and may enhance collection efficiency of carriers. The antireflective layer 171 of the second surface S2 and the additional passivation layer 172 of the first surface S1 may be concurrently (e.g., simultaneously) formed through one process, and may substantially include the same material, for example, the silicon nitride layer (SiNx).

Referring to FIG. 1G, an insulation layer 180 is formed on the first surface S1 of the semiconductor substrate 100. As will be described later, first and second electrodes, which respectively form an electrical connection to the first and second semiconductor layers 110 and 120, are formed, and the insulation layer 180 may function to insulate the first and second electrodes having opposite conductive types. For example, the insulation layer 180 may be formed over boundaries of the first and second semiconductor layers 110 and 120, and may be formed on the first surface S1 of the semiconductor substrate 100, that is, on the anti-diffusion layer 150 and the additional passivation layer 172. However, a location of the insulation layer 180 is not limited thereto.

For example, the insulation layer 180 may be formed of a hardening resin material such as polyimide, may be patterned by using screen printing or inkjet printing, and may be obtained through thermal hardening. Alternatively, the insulation layer 180 may be patterned by using screen printing or inkjet printing on an organosilicic compound comprising siloxane, and may be obtained through thermal hardening.

Figure 1J:
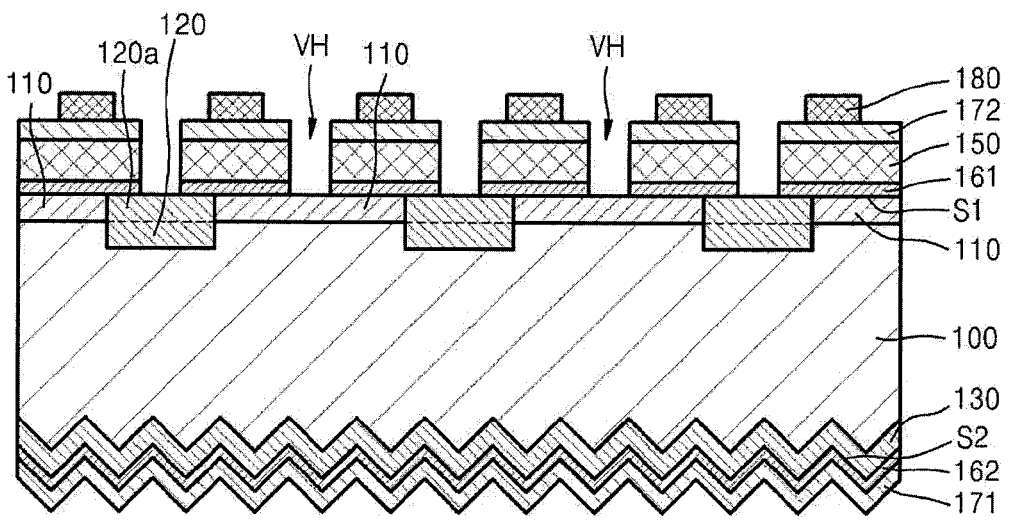

Referring to FIG. 1J, via holes VH are formed at the first surface S1 of the semiconductor substrate 100 for an electrode connection. More specifically, the via holes VH are formed by removing parts of the additional passivation layer 172, the anti-diffusion layer 150, and the passivation layer 161 that cover the first and second semiconductor layers 110 and 120 for the electrode connection. For example, the via holes VH may be formed corresponding to the first and second semiconductor layers 110 and 120, which are alternately formed on the semiconductor substrate 100.

For example, an etching paste may be applied to form the via holes VH, and may be patterned using screen printing or inkjet printing.

Figure 1K:
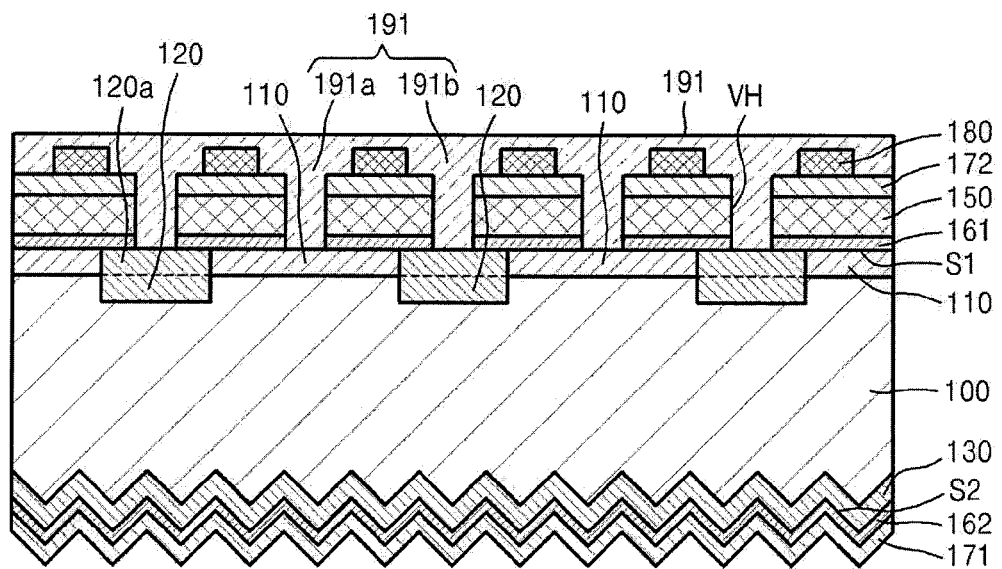

Referring to FIG. 1K, contact layers 191 are formed in the via holes VH as a part of an electrode. The contact layers 191 may include a multilayer structure in which aluminum (Al), titanium tungsten alloy (TiW), and copper (Cu) are sequentially stacked. For example, aluminum (Al) of the contact layers 191 may be used to reduce contact resistance with the first and second semiconductor layers 110 and 120, the titanium tungsten alloy (TiW) thereof may be used to prevent or reduce copper (Cu) from diffusing, and copper (Cu) thereof may be used as a seed of a plating process that will be described later.

However, the contact layers 191 may be generally formed to reduce contact resistance with the first and second semiconductor layers 110 and 120, to prevent or reduce copper (Cu) from diffusing, and/or as a seed of the plating process that will be performed later. For example, the contact layers 191 may be formed by using sputtering, and may be formed by continuously depositing aluminum (Al), titanium tungsten alloy (TiW), and copper (Cu) using high vacuum sputter equipment. Alternatively, the contact layers 191 may be formed by coating an aluminum metal paste including silver (Ag) in the via holes VH by using screen printing, and thermal hardening or sintering on the aluminum metal paste. In a case where the contact layers 191 are formed by using a metal paste, a process of forming gas annealing, which will be described later, may be omitted.

For example, the contact layers 191 may be formed to bury the via holes VH, and may be formed over substantially the entire surface S1 to cover the insulation layer 180 on the semiconductor substrate 100 after burying the via holes VH. In this regard, the contact layers 191 may include first contact layers 191a on the first semiconductor layer 110 and second contact layers 191b on the second semiconductor layer 120. Although the first contact layers 191a and the second contact layers 191b may be connected to each other, the first contact layers 191a and the second contact layers 191b are separated from each other through a process that will be described later, and thus may be insulated from each other.

Thereafter, the forming gas annealing is performed. Thermal processing is performed in a nitrogen atmosphere containing hydrogen of about 1% to about 10% and at a high temperature of about 250° C. to about 400° C. during the forming gas annealing. The forming gas annealing may improve contact resistance between the first and second semiconductor layers 110 and 120 and the contact layers 191, and may reduce a surface defect of the semiconductor substrate 100. For example, hydrogen atoms are coupled to a dangling bond, and thus a defect density may be reduced.

Figure 1L:
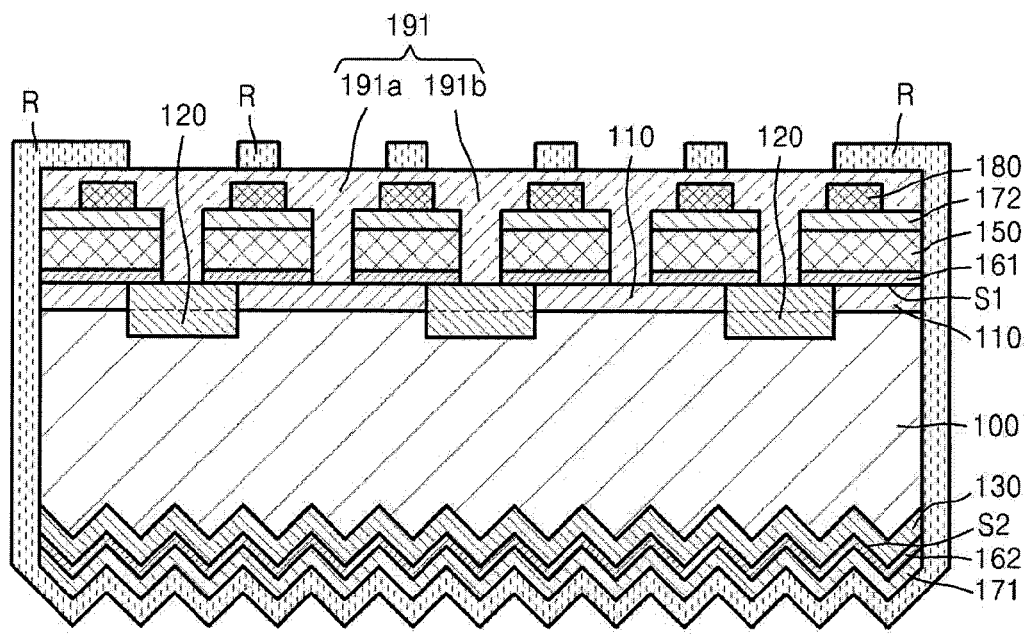
Figure 1M:
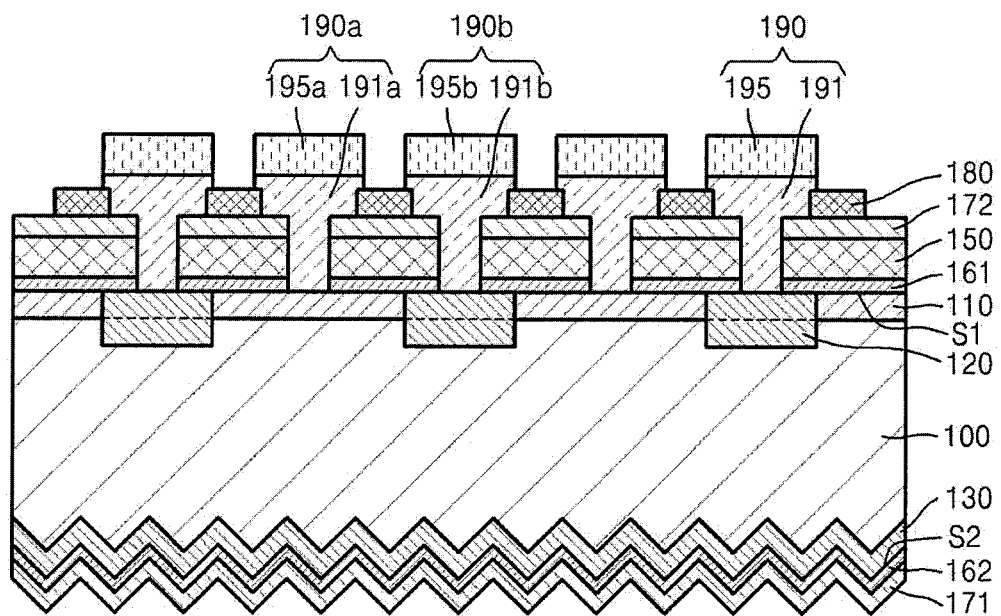

Referring to FIGS. 1L and 1M, a conductive connection layer 195 is formed on a selected part of the semiconductor substrate 100. More specifically, as shown in FIG. 1L, a resist R is coated. For example, the resist R may be formed on the insulation layer 180 using screen printing or inkjet printing, and may be additionally formed at outermost regions of the semiconductor substrate 100 including side surfaces of the semiconductor substrate 100. After forming the conductive connection layer 195, the resist R is removed, and thus the conductive connection layer 195 formed on the resist R may be also removed.

The conductive connection layer 195 may be formed on the contact layer 191, which may form an electrode 190. For example, the conductive connection layer 195 may become a medium for an electrical connection between the semiconductor substrate 100 and a wire substrate (not shown), and may form the electrical connection with the wire substrate through soldering. The conductive connection layer 195 may be formed by using wet electric plating having copper and tin as plating materials.

After the conductive connection layer 195 is formed, the resist R is removed, and thus the conductive connection layer 195 formed on the resist R is also removed. For example, the resist R may be removed by wet etching that applies chemicals. The contact layer 191 exposed from the conductive connection layer 195 is removed, and thus first and second electrodes 190a and 190b are separated from each other. For example, the contact layer 191 formed on the insulation layer 180 is removed, and thus the first and second electrodes 190a and 190b, more specifically, first and second contact layers 191a and 191b, are separated from each other. Such a separation of electrodes may be performed by wet etching.

As shown in FIG. 1M, the first contact layer 191a and a first conductive connection layer 195a may form the first electrode 190a electrically connected to the first semiconductor layer 110, and the second contact layer 191b and a second conductive connection layer 195b may form the second electrode 190b electrically connected to the second semiconductor layer 120. The first and second electrodes 190a and 190b are separated from each other, and thus the first and second electrodes 190a and 190b having opposite conductive types may be electrically insulated from each other.

A method of manufacturing a photoelectric device according to a comparison example in contrast with embodiments of the present invention will be described with reference to FIGS. 4A through 4L.

Figure 4A:
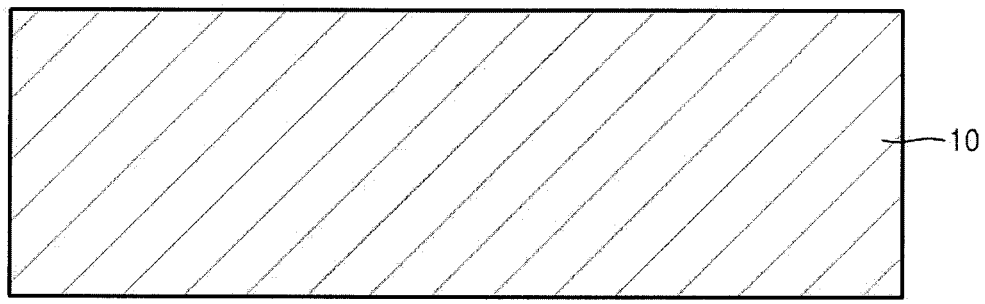
FIGS. 4A through 4L are sequential cross-sectional views for describing a method of manufacturing a photoelectric device according to a comparison example in contrast with embodiments of the present invention.

Referring to FIG. 4A, a semiconductor substrate 10 is prepared.

Figure 4B:
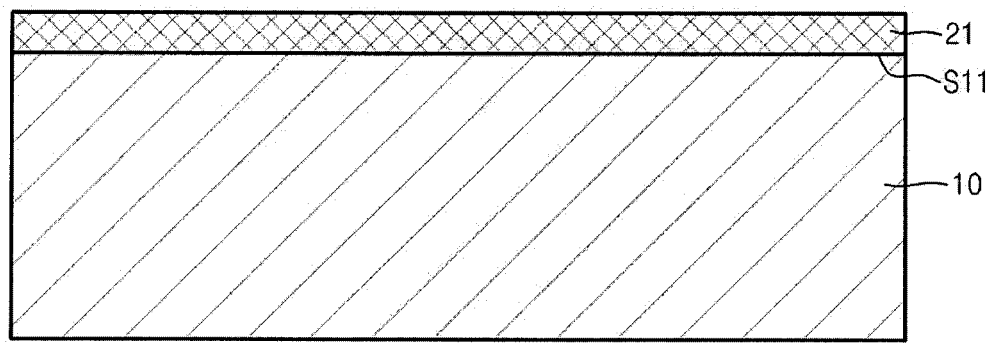
Figure 4C:
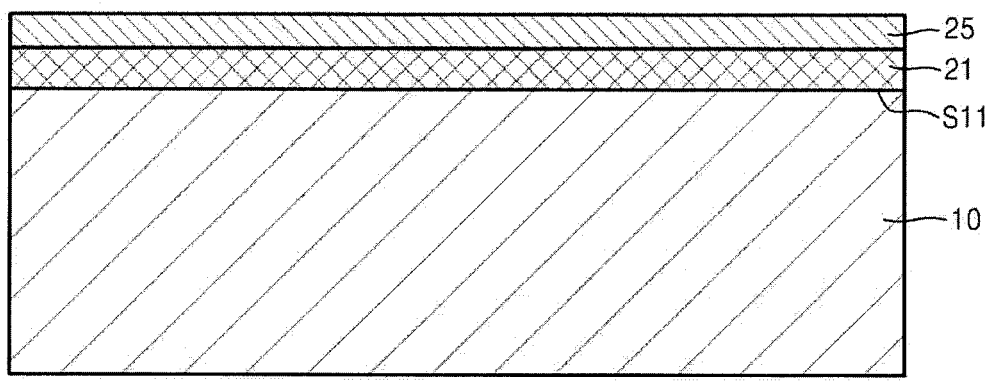

Referring to FIGS. 4B and 4C, a first doping material layer 21 and an anti-reflective layer 25 are formed on a first surface S11 of the semiconductor substrate 10. The first doping material layer 21 is formed of phosphosilicate glass (PSG) or boron silicate glass (BSG) including p-type or n-type dopants that are inverse to those of the semiconductor substrate 10. The anti-reflective layer 25 is formed of USG that does not include p-type or n-type dopants.

Figure 4D:
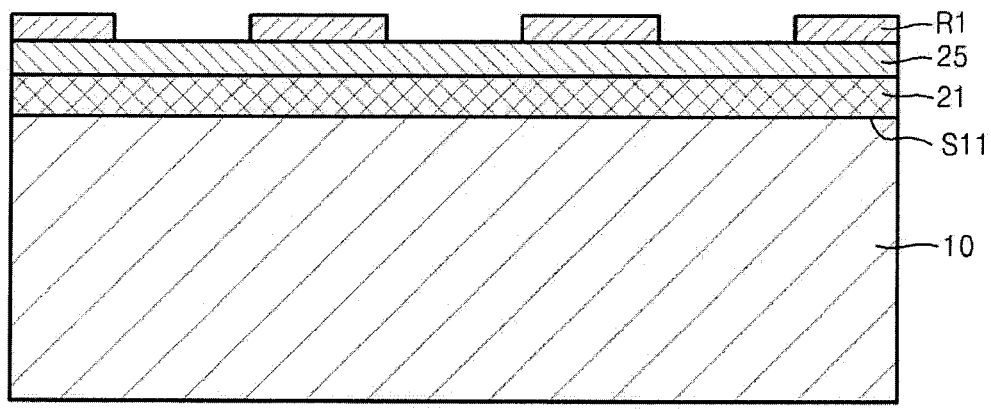

Referring to FIG. 4D, the resist R1 is patterned on the anti-reflective layer 25. The resist R1 is used to selectively form a first semiconductor layer in a part of the semiconductor substrate 10, and is patterned corresponding to the first semiconductor layer.

Figure 4E:
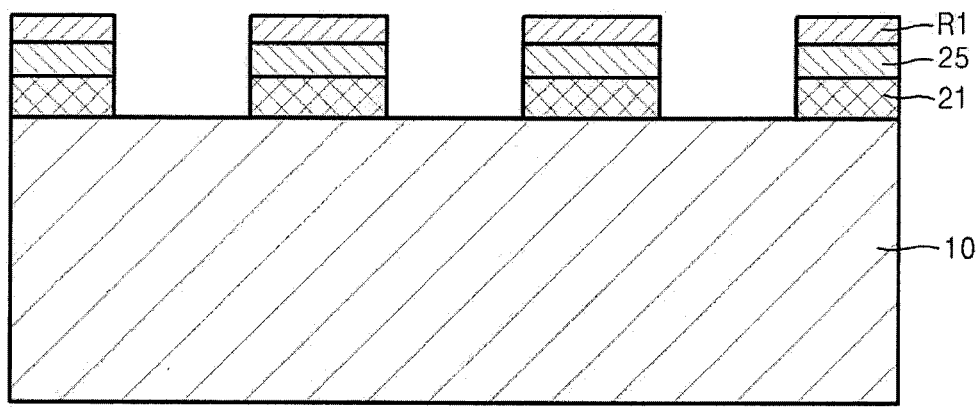
Figure 4F:
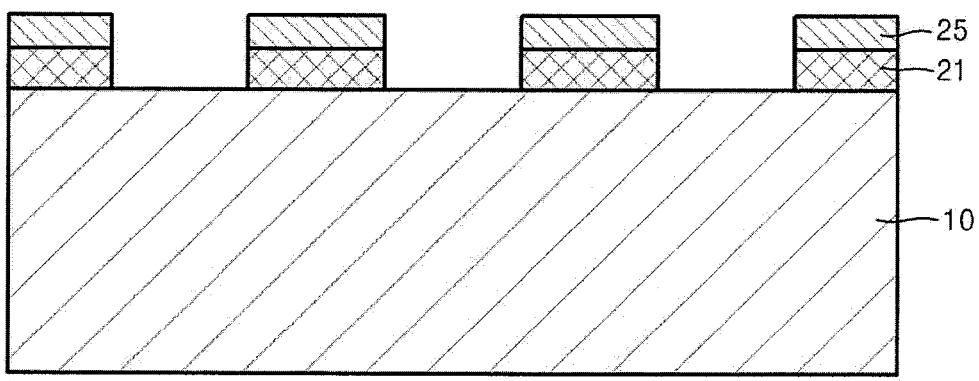

Referring to FIG. 4E, the first doping material layer 21 and the anti-reflective layer 25 exposed by the openings of the pattern of the resist R1 may be etched and removed by using the resist R1 as an etching protection layer. The first doping material layer 21 and the anti-reflective layer 25 are removed by applying hydrofluoric acid (HF) or a buffered oxide etchant (BOE). As shown in FIG. 4F, after etching, the resist R1 that is no longer useful is removed through separate chemical processing.

Figure 4G:
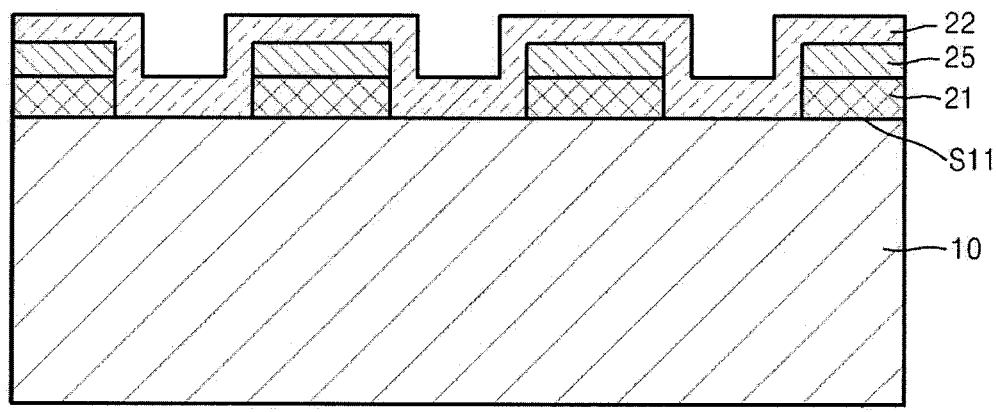
Figure 4H:
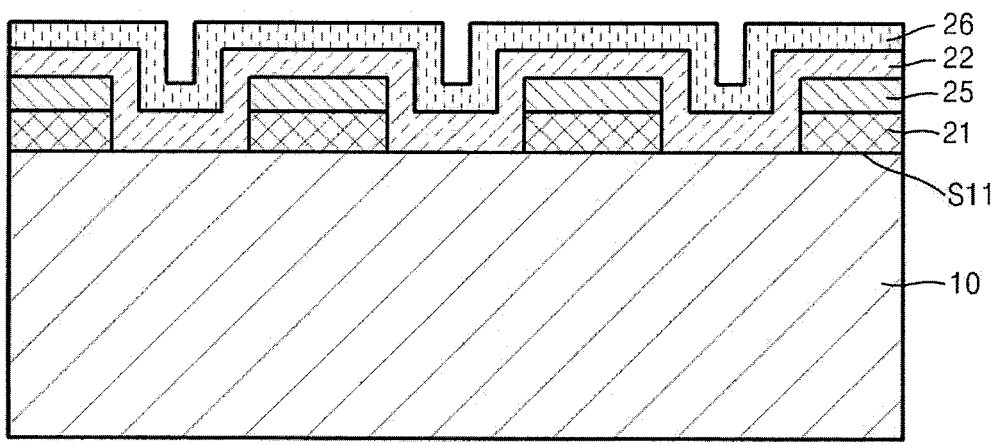

Referring to FIGS. 4G and 4H, a second doping material layer 22 and an anti-reflective layer 26 are formed on the first surface S11 of the semiconductor substrate 10. The second doping material layer 22 is formed of PSG or BSG including p-type or n-type dopants, and is the same conductive type as that of the semiconductor substrate 10. The anti-reflective layer 26 is formed of USG that does not include p-type or n-type dopants.

Figure 4I:
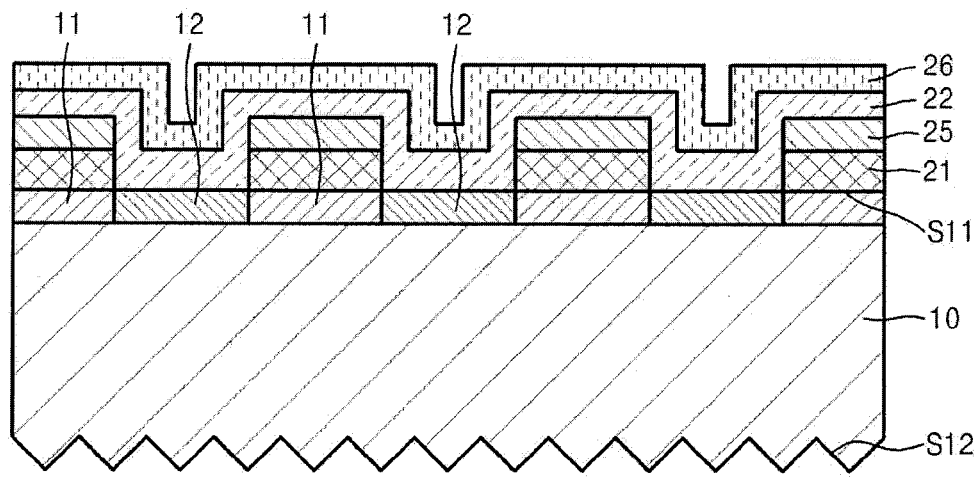

Referring to FIG. 4I, a drive-in that diffuses dopants of the first and second doping material layers 21 and 22 into the semiconductor substrate 10 is performed. If the p-type and n-type dopants of the first and second doping material layers 21 and 22 diffuse into the semiconductor substrate 10, the first and second semiconductor layers 11 and 12 are formed at the first surface S11 of the semiconductor substrate 10.

Referring to FIG. 4I, texturing is performed on the second surface S12 of the semiconductor substrate 10. A texture structure, by which reflectivity of incident light is reduced, is formed at the second surface S12 of the semiconductor substrate 10. The first and second doping material layers 21 and 22 and the anti-diffusion layers 25 and 26 formed on the first surface S11 of the semiconductor substrate 10 may function as anti-etching layers during texturing, and the first surface S11 of the semiconductor substrate 10 covered by the first and second doping material layers 21 and 22 and the anti-diffusion layers 25 and 26 may be protected.

Figure 4J:
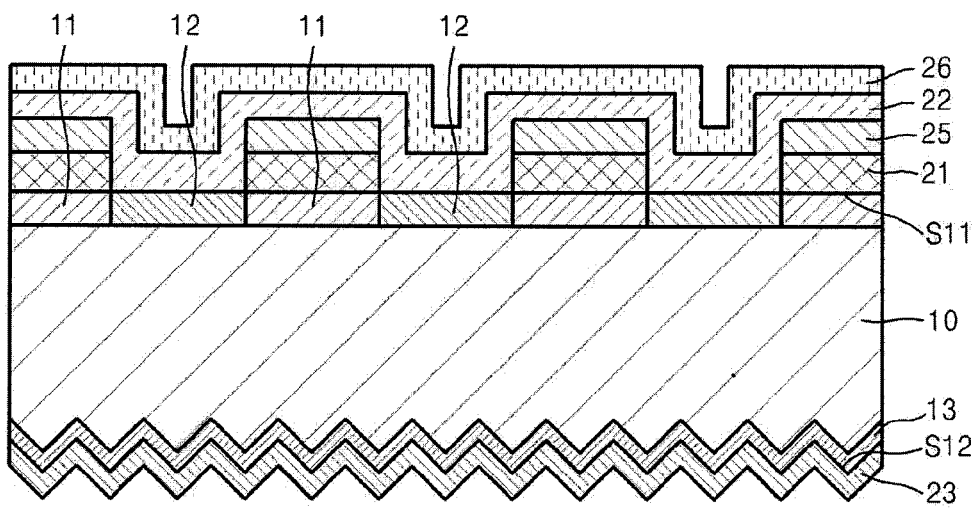

Referring to FIG. 4J, an FSF 13 (e.g., a third semiconductor layer) is formed at the second surface S12 of the semiconductor substrate 10. For example, a doping source that includes the p-type or n-type dopants that are the same conductive type as those of the semiconductor substrate 10 may be provided on the semiconductor substrate 10. For example, phosphorus oxychloride ($POCl_3$) may be provided on the semiconductor substrate 10 in a diffusion tube and as the doping source through a reaction gas that is a mixture of nitrogen and oxygen. In this regard, as dopants of the doping source diffuse into the semiconductor substrate 10, an oxide grows on the surface of the semiconductor substrate 10, and a third doping material layer 23 having a glass layer (such as PSG or BSG) may be formed.

Figure 4K:
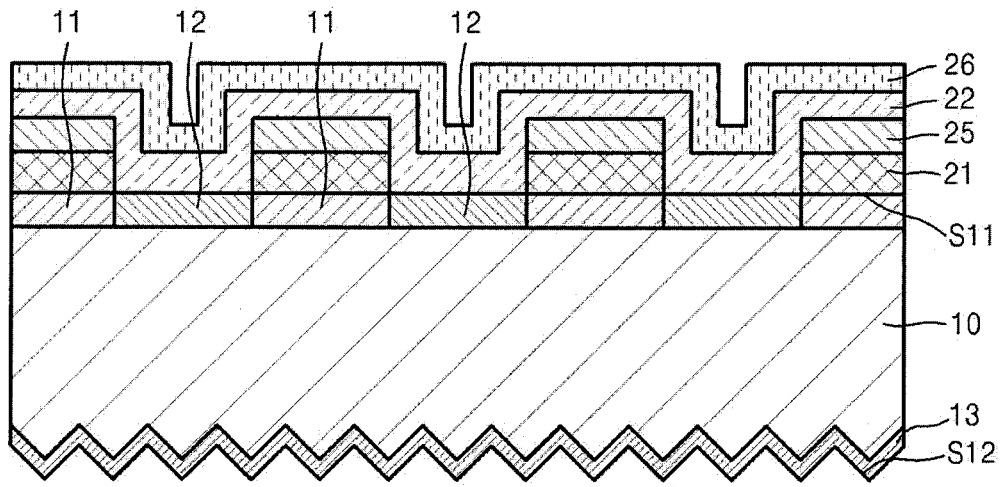

Referring to FIG. 4K, the third doping material layer 23 formed on the second surface S12 of the semiconductor substrate 10 is removed. For example, PSG or BSG as the third doping material layer 23 includes a precipitate of metal impurity components included in the semiconductor substrate 10, and thus the third doping material layer 23 may be removed. The third doping material layer 23 may be removed through wet etching using hydrofluoric acid (HF) or a BOE.

Figure 4L:
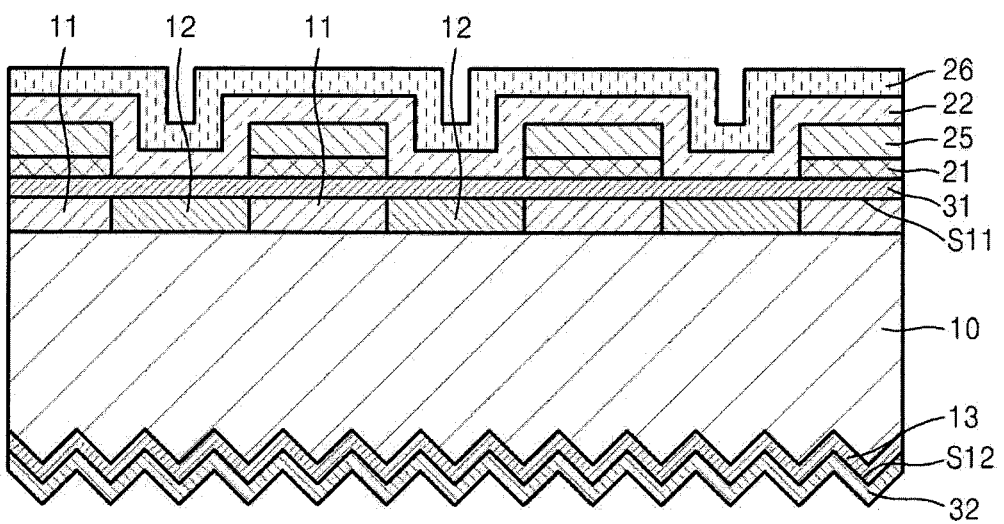

Referring to FIG. 4L, passivation layers 31 and 32 are formed at the first and second surfaces S11 and S12 of the semiconductor substrate 10. The formation of the passivation layers 31 and 32 includes an oxidation process. The passivation layers 31 and 32 including silicon oxide layers are formed.

The series of processes shown in FIGS. 4A through 4L are to form the first and second semiconductor layers 11 and 12 on the first surface S11 of the semiconductor substrate 10, and are to form the FSF 13 on the second surface S12 of the semiconductor substrate 10, and require a relatively greater number of processes compared to embodiments of the present invention described with reference to FIGS. 1A through 1G.

In the manufacturing process of the present invention, the first semiconductor layer 110 is formed by applying the first ion implantation over the front surface of the semiconductor substrate 100, and by applying the first and second implantations in a selected region overlappingly, and thus the counter doped second semiconductor layer 120 is formed. Accordingly, the manufacturing process of embodiments of the present invention reduces manufacturing steps, which reduces a process defect rate, thereby improving product yield, and reducing manufacturing cost.

Furthermore, the first and second semiconductor layers 110 and 120 of the first surface S1 of the semiconductor substrate 100, and the FSF 130 of the second surface S2, are formed through ion implantations, thereby easily controlling a dose of ions implanted into the semiconductor substrate 100, an amount of energy that accelerates ion beam(s) during ion implantations, and a doping profile and a junction depth. As described above, the ion dose and the doping profile are controlled, thereby reducing a junction leakage current, enhancing an open circuit voltage, and, ultimately, enhancing a photoelectric conversion efficiency.

In the comparison example of FIGS. 4A through 4L, the first and second semiconductor layers 11 and 12 and the FSF 13 are formed through heat diffusion of PSG or BSG or through an application of the doping source like $POCl_3$. However, according to the comparison example, the doping concentration in the semiconductor substrate 10 is not uniform, and photoelectric conversion efficiency for each photoelectric device varies. In embodiments of the present invention that form the first and second semiconductor layers 110 and 120 and the FSF 130 through ion implantations, uniformity of the doping concentration is improved, variation of photoelectric conversion efficiency for each photoelectric device is reduced, and more uniform output characteristics may result.

Referring to FIG. 4K of the comparison example, after the FSF 13 is formed, although wet etching may be used for removing the third doping material layer 23, such as the additionally generated PSG or BSG, such separate wet etching is unnecessary for embodiments of the present invention that apply the ion implantations. Also, a plurality of non-activation dopants exist in the FSF 13 of the comparison example, and thus absorption efficiency of single wavelength light is reduced, and surface recombination loss of carriers generated from the semiconductor substrate 10 increases.

However, non-activation dopants are reduced in the FSF 130 formed through the ion implantations of the present invention, and thus the absorption efficiency of single wavelength light increases, and surface recombination loss of carriers generated from the semiconductor substrate 10 is reduced. Furthermore, an amount of energy that accelerates an ion beam(s) increases during the ion implantations, and thus an implantation depth of a dopant may increase, thereby improving characteristics of a short-circuit current and an open circuit voltage, thereby increasing the photoelectric conversion efficiency.

FIGS. 5A through 5L are sequential cross-sectional views for describing a method of manufacturing a photoelectric device, according to another embodiment of the present invention.

Figure 5A:
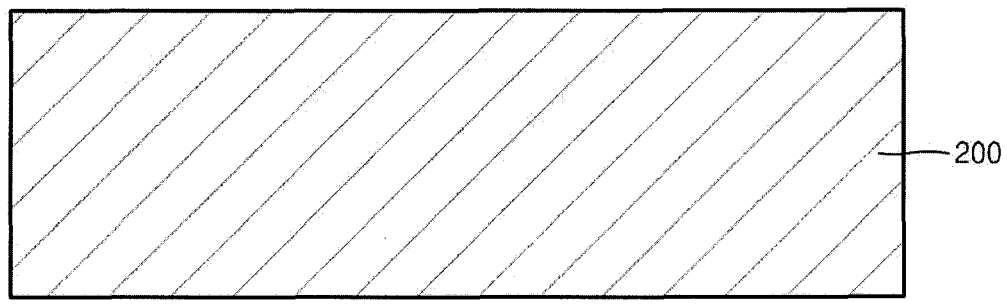
FIGS. 5A through 5L are sequential cross-sectional views for describing a method of manufacturing a photoelectric device, according to another embodiment of the present invention.

Referring to FIG. 5A, a semiconductor substrate 200 is prepared. The semiconductor substrate 200 may be prepared as an n-type or p-type crystalline silicon wafer.

Figure 5B:
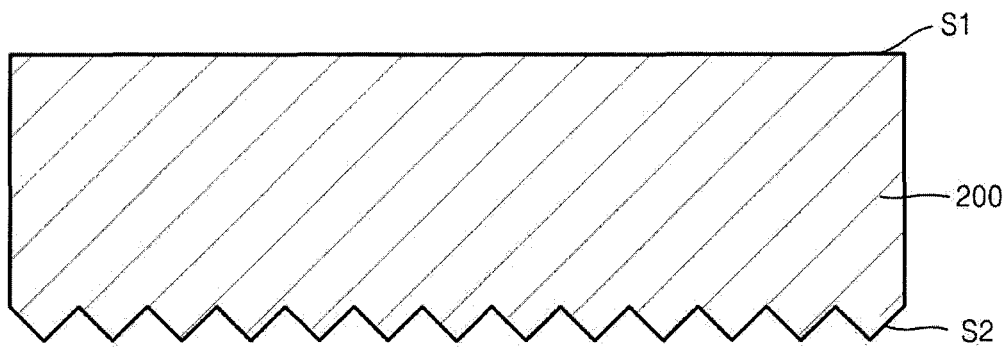

Referring to FIG. 5B, texturing is performed on the second surface S2 of the semiconductor substrate 200. For example, an etchant including IPA and adhesive added to an aqueous solution, such as KOH or NaOH, is applied to the semiconductor substrate 200 during texturing. In this regard, a texture structure of a pyramid pattern may be formed at the second surface S2 of the semiconductor substrate 200 according to anisotropic etching characteristics with respect to a crystalline direction of single crystal silicon.

Although not shown in FIG. 5B, the texture structure of the pyramid pattern may be formed at the first surface S1 of the semiconductor substrate 200, and the texture structured formed by applying the aqueous solution, such as KOH or NaOH, may be removed. According to another embodiment of the present invention, subsequent processes may be performed in a status where the texture structures are formed in the first and second surfaces S1 and S2 of the semiconductor substrate 200.

Figure 5C:
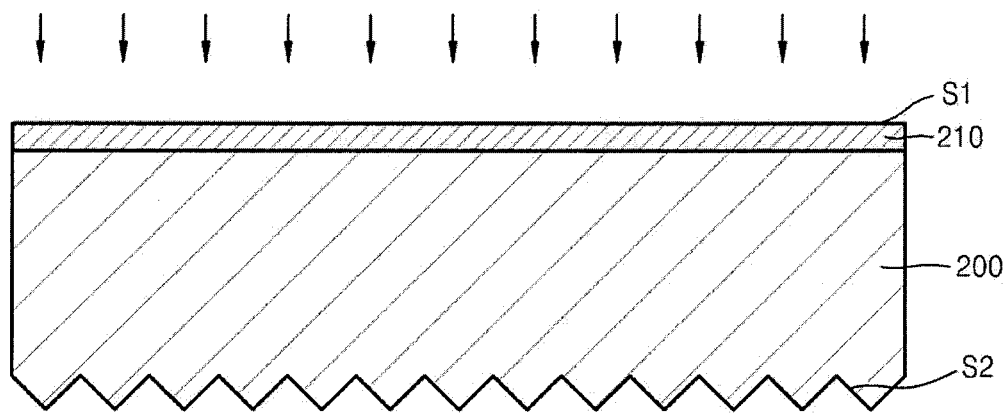

Referring to FIG. 5C, a first semiconductor layer 210 is formed on the semiconductor substrate 200 by using a first implantation. The first implantation may be performed over the first surface S1 of the semiconductor substrate 200. The first semiconductor layer 210 may be formed over substantially all of the semiconductor substrate 200.

The first semiconductor layer 210 may be doped with a conductive type that is inverse to that of the semiconductor substrate 200, and may form a p-n junction. The first semiconductor layer 210 may be formed as a doping layer having an inverted conductive type by implanting a p-type dopant into an n-type semiconductor substrate or by implanting an n-type dopant into a p-type semiconductor substrate. The first semiconductor layer 210 may form an emitter that collects minority carriers generated from the semiconductor substrate 200.

Figure 5D:
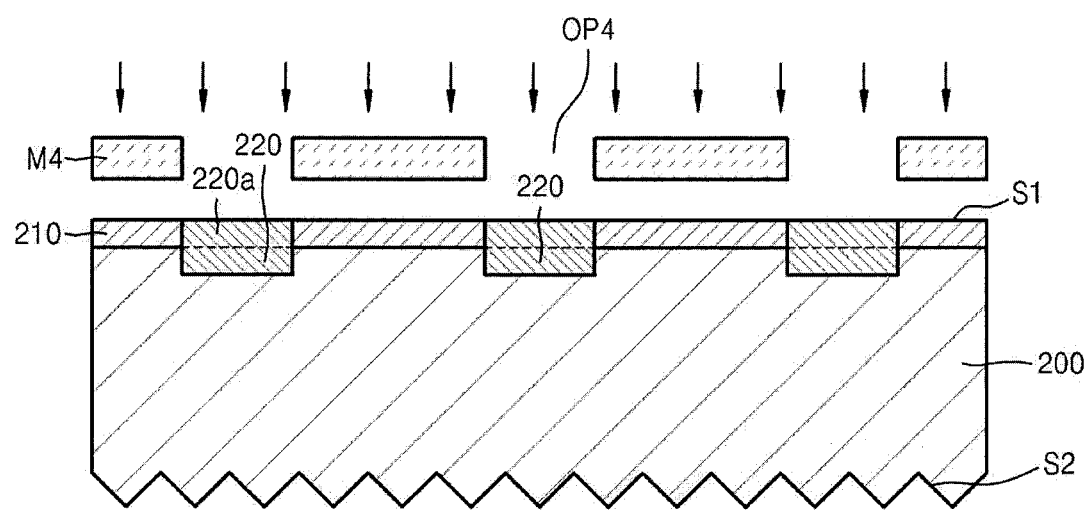

Referring to FIG. 5D, second semiconductor layers 220 are formed on the semiconductor substrate 200 by using a second ion implantation. The second ion implantation is performed by selectively implanting ions in a region corresponding to an opening pattern OP4 using a mask M4 in which the opening pattern OP4 is formed. The second semiconductor layers 220 are formed in a part of the semiconductor substrate 200. During the second ion implantation, counter doping, which implants a dopant having an inverse conductive type to that of the first semiconductor layer 210, is performed, and thus the second semiconductor layers 220 having a conductive type, which is inverse to that of the first semiconductor 210, may be formed. The surfaces of the second semiconductor layers 220 may include counter doping units 220a doped in the same conductive types as that of the first semiconductor layer 210 after the first ion implantation, and may then include inverted conductive types by implanting a dopant having an inverse conductive type during the second ion implantation.

For example, the second semiconductor layers 220 may be doped with the same conductive type as, and at a higher concentration than, that of the semiconductor substrate 200, and may form an h-l junction (high-low junction). The second semiconductor layers 220 may be formed by implanting the n-type dopant into the n-type semiconductor substrate 200, or by implanting the p-type dopant into the p-type semiconductor substrate 200. The second semiconductor layers 220 may form bases that collect a plurality of carriers generated from the semiconductor substrate 200. The second semiconductor layers 220 may form a BSF to reduce a surface recombination loss in the first surface S1 of the semiconductor substrate 100, that is, in a rear surface thereof.

Figure 5E:
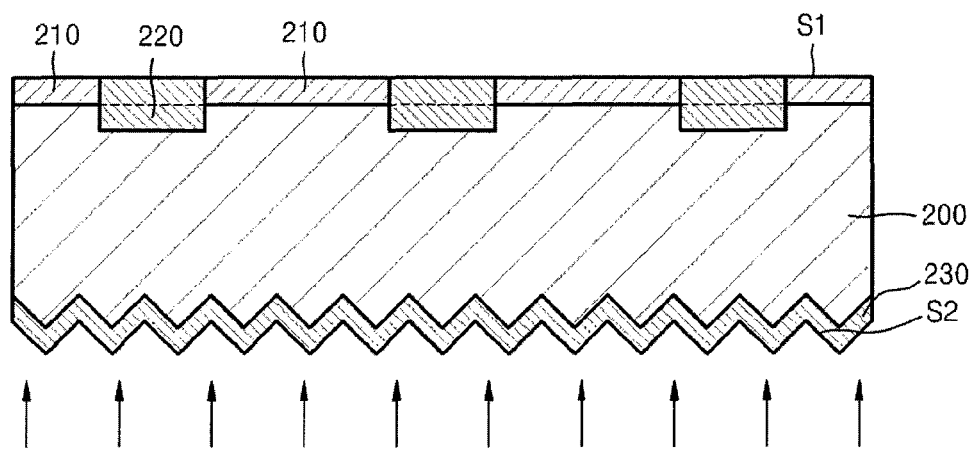

Referring to FIG. 5E, a third ion implantation is used to form a FSF (e.g., a third semiconductor layer) 230 on the second surface S2 of the semiconductor substrate 200. The third ion implantation may be at substantially all of the second surface S2 of the semiconductor substrate 200. The FSF 230 may be formed in substantially all of the second surface S2.

The FSF 230 may be doped with the same conductive type as, and at a higher concentration than, that of the semiconductor substrate 200 to form the h-l junction (high-low junction). The FSF 230 may be formed by implanting the n-type dopant into the n-type semiconductor substrate 200, or by implanting the p-type dopant into the p-type semiconductor substrate 200. For example, the FSF 230 may reduce the number of, or prevent altogether, minority carriers from moving to the second surface S2 and recombining, and may reduce surface recombination loss in the second surface S2, by forming a high concentration doping layer in the second surface S2 of the semiconductor substrate 200.

Figure 5F:
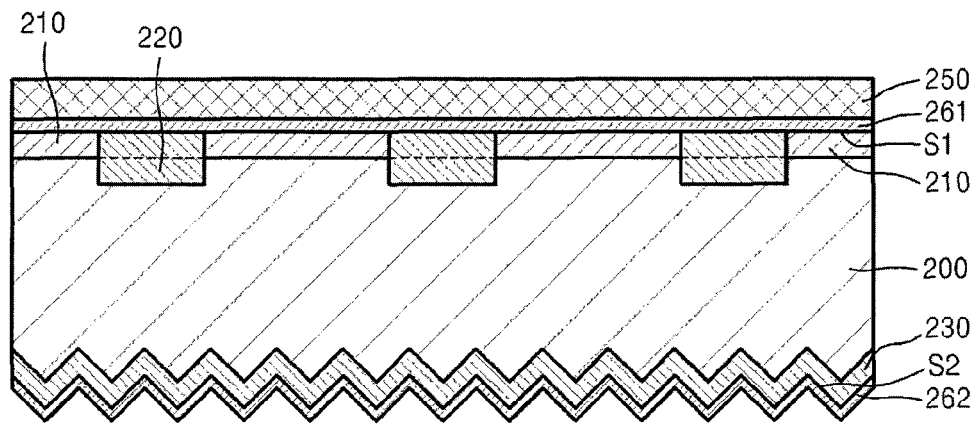

Referring to FIG. 5F, an anti-diffusion layer 250 is formed on the first surface S1 of the semiconductor substrate 200. The anti-diffusion layer 250 prevents, or reduces the likelihood of, a dopant implanted in the semiconductor substrate 200 from diffusing outside the substrate 200 during a thermal processing operation. To reduce or prevent the dopant having an increased diffusion speed in a high temperature environment for thermal processing from diffusing to outside of the semiconductor substrate 200, the anti-diffusion layer 250 is formed on the first surface S1 of the semiconductor substrate 200 in which the first and second semiconductor layers 110 and 120 are formed.

Silicate glass may be applied as the anti-diffusion layer 250. More specifically, USG, which does not include the p-type or n-type dopant, may be applied as the anti-diffusion layer 250.

Referring to FIG. 5F, united thermal processing for forming passivation layers 261 and 262 on the semiconductor substrate 200 is performed, while lattice damage of the semiconductor substrate 200 due to ion shocks of the first and second ion implantations is restored, and implanted dopants are activated.

In the present embodiment, thermal processing for restoring the lattice damage of the semiconductor substrate 200, for activating the implanted dopants, and for passivating the semiconductor substrate 200 are united into one process, thereby reducing waste spent in separately administrating and managing equipment for thermal processing and passivation, and thermal processing and passivation requiring a relatively long period of processing time are united into one process, thereby reducing the whole processing time and the number of processing steps.

The united process of thermal processing may form a silicon oxide layer as the passivation layers 261 and 262 on the first and second surfaces S1 and S2, and may include an oxidation process for forming the silicon oxide layer.

For example, the united process of thermal processing may include first and second processing, which are continuously performed. Although the first and second processing are distinctive processes that add different processing conditions corresponding to at least one of a temperature condition, a pressure condition, and a reaction gas (or atmosphere) as processing parameters, the first and second processing are performed continuously and applied to the same reactor (not shown) containing the semiconductor substrate 200. For example, one of the first and second processing has a main objective being the oxidation process for passivating the semiconductor substrate 200, and another has a main objective being the restoration of the lattice damage of the semiconductor substrate 200 and activation of implanted dopants.

The following i) and iv) processing conditions may be added to the united process of thermal processing, and one of them may be selectively applied thereto.

i) The first processing is performed at a high temperature of about 950° C. to about 1100° C., at a low pressure below about 0.5 torr as a pressure of a reactor in a nitrogen atmosphere for about 10 minutes to about 100 minutes.

In the subsequent second processing, an oxygen radical(s) is formed by supplying hydrogen and oxygen together at the same temperature of about 950° C. to about 1100° C. as in the first processing, or at a lower temperature of about 800° C. to about 950° C.

ii) The first processing is performed at a high temperature of about 950° C. to about 1100° C., at a high pressure above about 700 torr as a pressure of a reactor in a nitrogen atmosphere for about 10 minutes to about 100 minutes.

The subsequent second processing is performed in an oxygen atmosphere or a reaction gas containing hydrogen chloride or hydrogen is implanted in the oxygen atmosphere at the same temperature of about 950° C. to about 1100° C. as in the first processing or at a lower temperature of about 800° C. to about 950° C.

iii) In the first processing, an oxygen radical(s) is formed by supplying hydrogen and oxygen together at a high temperature of about 800° C. to about 950° C., at a low pressure below about 0.5 torr as a pressure of a reactor.

The subsequent second processing is performed at a high temperature of about 950° C. to about 1100° C. in a nitrogen atmosphere for about 10 minutes to about 100 minutes.

iv) The first processing is performed in an oxygen atmosphere or a reaction gas containing hydrogen chloride or hydrogen is implanted in the oxygen atmosphere at a high temperature of about 800° C. to about 950° C., at a high pressure above about 700 torr as a pressure of a reactor.

The subsequent second processing is performed at a high temperature of about 950° C. to about 1100° C. in a nitrogen atmosphere for about 10 minutes to about 100 minutes.

Figure 5G:
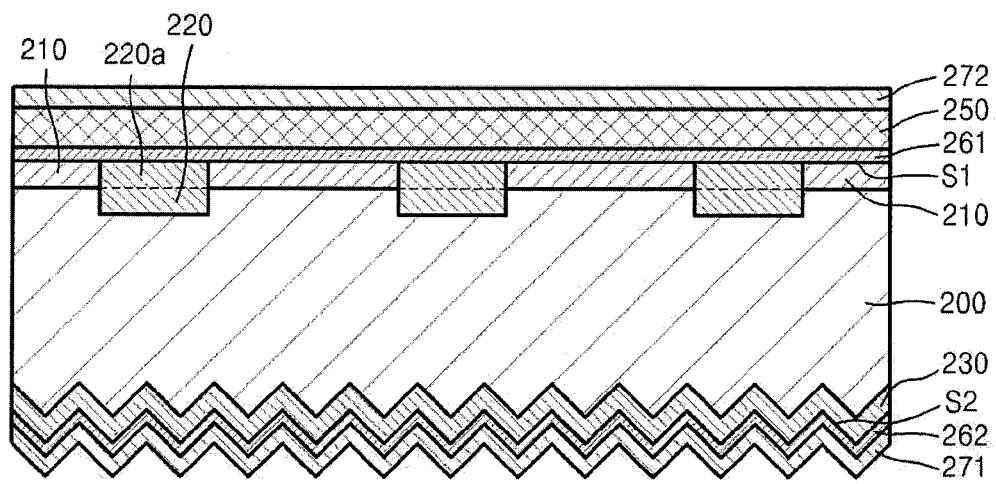

Referring to FIG. 5G, an antireflective layer 271 is formed at the second surface S2 of the semiconductor surface 200. For example, the antireflective layer 271 may be formed as a silicon nitride layer (SiNx). The antireflective layer 271 may be formed by using a CVD process. The antireflective layer 271 inhibits incident light from, or reduces the amount of incident light, being reflected, thereby promoting absorption of light of the semiconductor substrate 200 and increasing collection efficiency of light.

Meanwhile, the antireflective layer 271 is formed at the second surface S2 of the semiconductor substrate 200, and an additional passivation layer 272 may be concurrently (e.g., simultaneously) formed on the first surface S1. The additional passivation layer 272 may reduce surface recombination loss of carriers in the first surface S1 of the semiconductor substrate 200, and may enhance collection efficiency of carriers. The antireflective layer 271 of the second surface S2 and the additional passivation layer 272 of the first surface S1 may be concurrently (e.g., simultaneously) formed through one process, and may substantially include the same material.

Figure 5H:
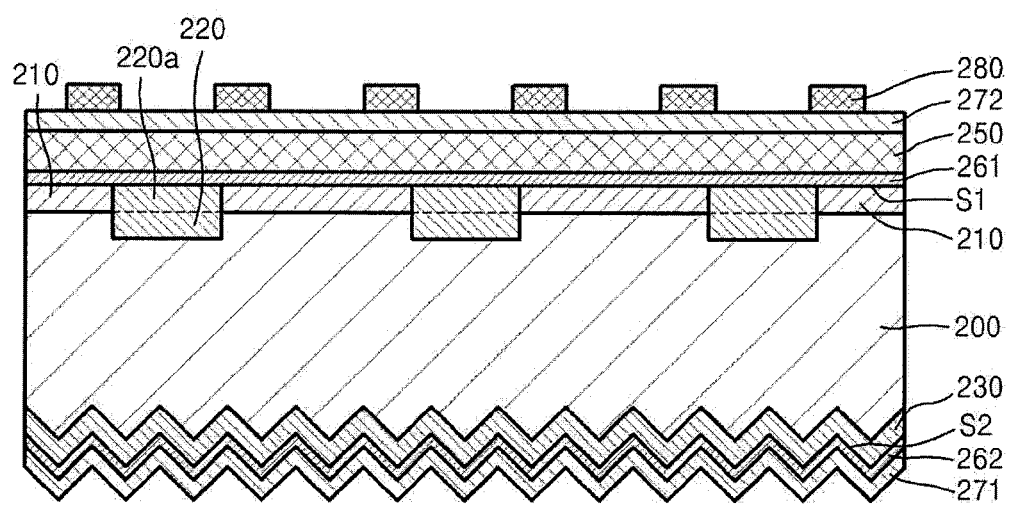

Referring to FIG. 5H, an insulation layer 280 is formed at the first surface S1 of the semiconductor substrate 200. As will be described later, first and second electrodes that form an electrical connection to the first and second semiconductor layers 210 and 220 are formed, and the insulation layer 180 may function to insulate the first and second electrodes having opposite conductive types. For example, the insulation layer 280 may be formed of a hardening resin material such as polyimide, and may be obtained by performing thermal hardening on a patterned hardening resin material by using screen printing or inkjet printing.

Figure 5I:
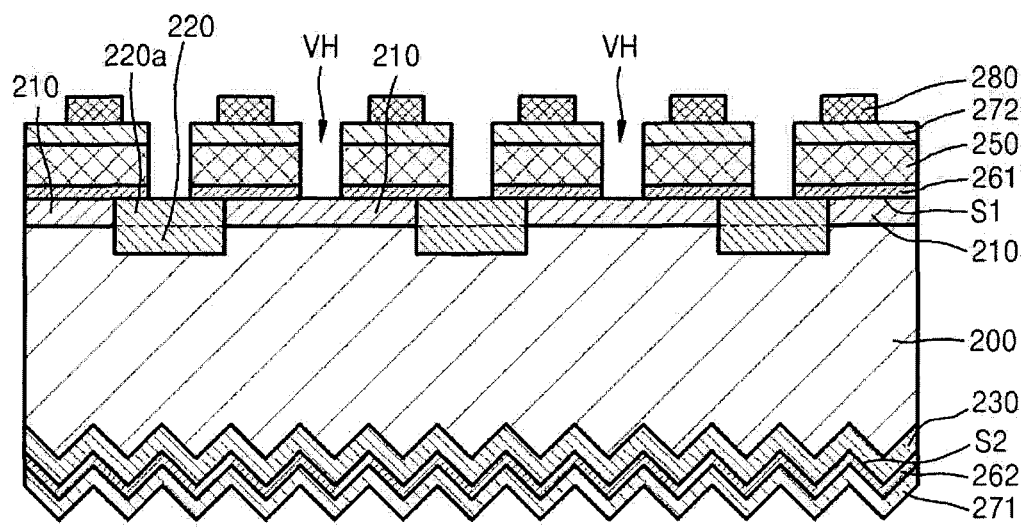

Referring to FIG. 5I, via holes VH are formed on the first surface S1 of the semiconductor substrate 200 for an electrode connection. More specifically, the via holes VH are formed by removing parts of the additional passivation layer 272, the anti-diffusion layer 250, and the passivation layer 261 that cover the first and second semiconductor layers 210 and 220 for the electrode connection. For example, the via holes VH may be formed corresponding to the first and second semiconductor layers 210 and 220 that are alternately formed on the semiconductor substrate 200.

Figure 5J:
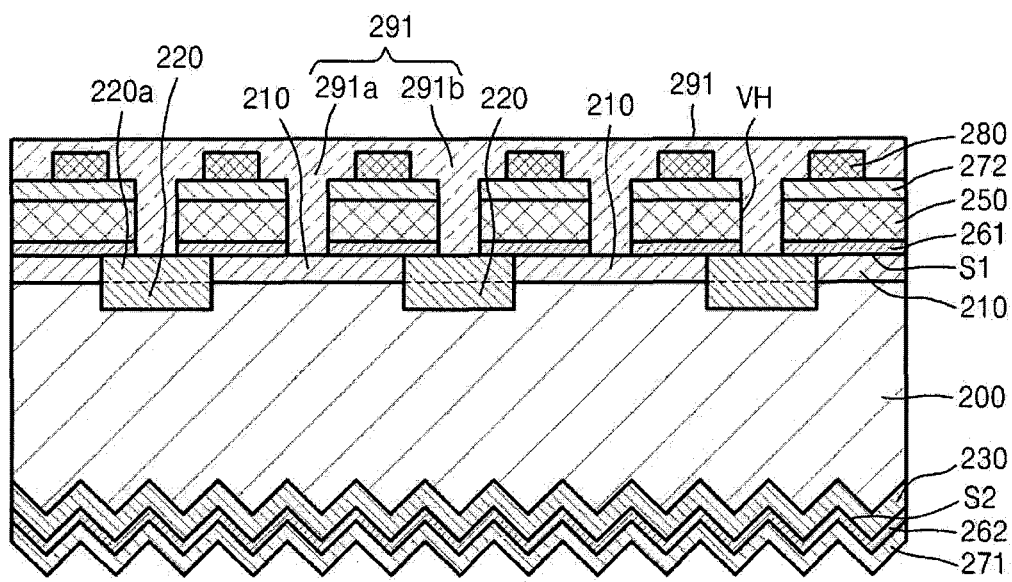

Referring to FIG. 5J, contact layers 291 are formed in the via holes VH. The contact layers 291 may include a multi-layer structure in which aluminum (Al), titanium tungsten alloy (TiW), and copper (Cu) are sequentially stacked. For example, aluminum (Al) of the contact layers 291 may be used to reduce contact resistance with the first and second semiconductor layers 210 and 220, the titanium tungsten alloy (TiW) may be used to prevent or reduce copper (Cu) from diffusing, and the copper (Cu) may be used as a seed of a plating process.

For example, the contact layers 291 may be formed to bury the via holes VH, and may be formed over substantially the entire first surface S1 to cover the insulation layer 280 on the semiconductor substrate 100 after burying the via holes VH. In this regard, the contact layers 291 may include first contact layers 291a on the first semiconductor layer 210 and second contact layers 291b on the second semiconductor layer 220. Although the first contact layers 291a and the second contact layers 291b may be coupled to each other, the first contact layers 291a and the second contact layers 291b are separated from each other through a process that will be described later, and thus may be insulated from each other.

Thereafter, the process of forming gas annealing is performed. Thermal processing is performed in a nitrogen atmosphere containing hydrogen of about 1% to about 10% and at a high temperature of about 250° C. to about 400° C. during the forming gas annealing. The forming gas annealing may improve contact resistance between the contact layers 291 and the first and second semiconductor layers 210 and 220, and may reduce a surface defect of the semiconductor substrate 200. For example, hydrogen atoms are coupled to a dangling bond and thus a defect density may be reduced.

Figure 5K:
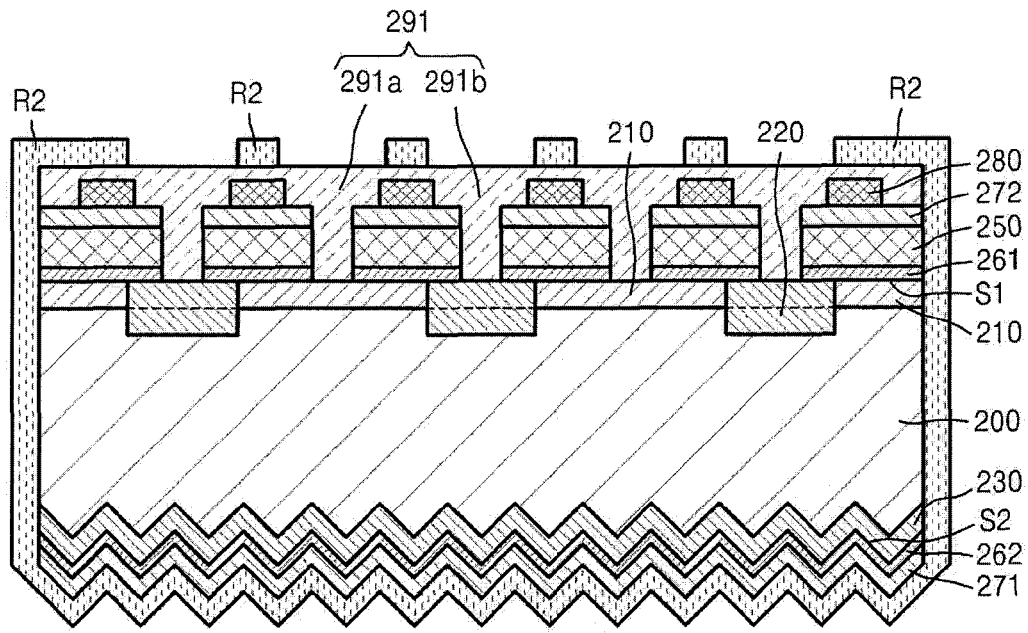
Figure 5L:
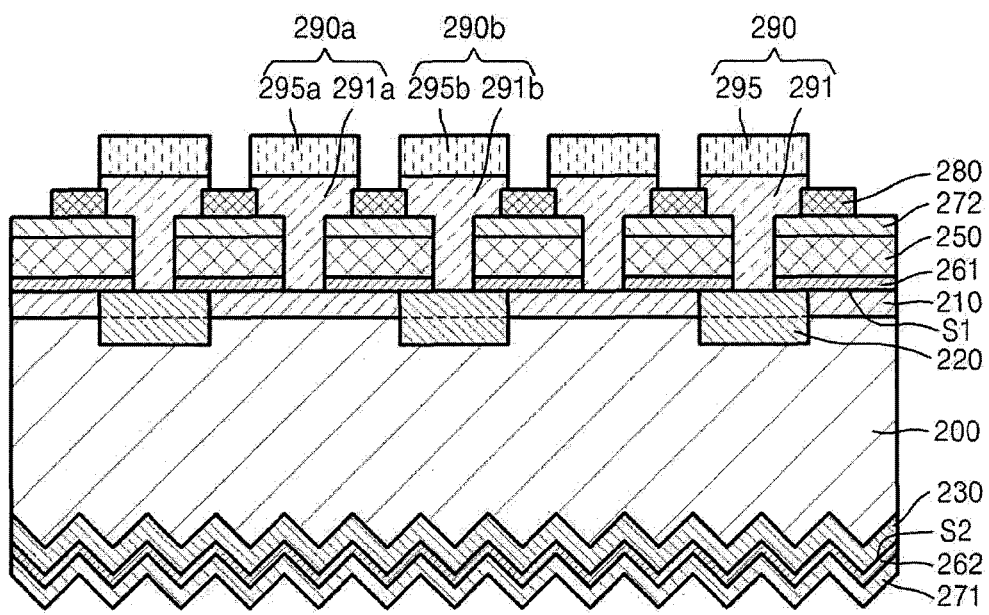

Referring to FIGS. 5K and 5L, a conductive connection layer 295 is formed on a selected part of the semiconductor substrate 200. More specifically, as shown in FIG. 5K, a resist R2 is coated. For example, the resist R2 may be formed on the insulation layer 280, and may be additionally formed at outermost regions of the semiconductor substrate 100 including side surfaces of the semiconductor substrate 200.

As shown in FIG. 5L, the conductive connection layer 295 is formed on a contact layer 291, which may form an electrode 290. For example, the conductive connection layer 295 may become a medium for an electrical connection between the semiconductor substrate 200 and a wire substrate (not shown), and may form the electrical connection with the wire substrate through soldering. The conductive connection layer 295 may be formed by using wet electric plating having copper and tin as plating materials.

After the conductive connection layer 295 is formed, the resist R2 is removed, and thus the conductive connection layer 295 formed on the resist R2 is also removed. For example, the resist R2 may be removed by wet etching that applies chemicals. The contact layer 291 exposed from the conductive connection layer 295 is removed, and thus first and second electrodes 290a and 290b are separated from each other. For example, the contact layer 291 formed on the insulation layer 280 is removed, and thus the first and second electrodes 290a and 290b, more specifically, first and second contact layers 291a and 292b, are separated from each other. Such a separation of electrodes may be performed by wet etching.

For example, the first contact layer 291a and a first conductive connection layer 295a may form the first electrode 290a electrically connected to the first semiconductor layer 210, and the second contact layer 291b and a second conductive connection layer 295b may form the second electrode 290b electrically connected to the second semiconductor layer 220. The first and second electrodes 290a and 290b are separated from each other, and thus the first and second electrodes 290a and 290b having opposite conductive types may be electrically insulated from each other.

It should be understood that the exemplary embodiments described herein should be considered in a descriptive sense only, and not for purposes of limitation. Descriptions of features or aspects within each embodiment should typically be considered as available for other similar features or aspects in other embodiments.

DESCRIPTION OF SOME OF THE REFERENCE CHARACTERS 100, 200: semiconductor substrate
110, 210: first semiconductor layer
120, 220: second semiconductor layer
120a, 220a: counter doping unit
130, 230: FSF
150, 250: anti-diffusion layer
161, 162, 261, 262: passivation layer
171, 271: antireflective layer
172, 272: additional passivation layer
180, 280: insulation layer
190, 290: electrode
190a, 290a: first electrode
190b, 290b: second electrode
191, 291: contact layer
191a, 291a: first contact layer
191b, 291b: second contact layer
195, 295: conductive connection layer
195a, 295a: first conductive connection layer
195b, 295b: second conductive connection layer
M1, M2, M3, M4: mask
s1: first surface of semiconductor substrate s2: second surface of semiconductor substrate
op, op1, op2, op3, op4: opening pattern of mask
c1, c2: closed part of mask
VH: via hole
r, r2: resist

What is claimed is:

1. A method of manufacturing a photoelectric device, the method comprising:
    forming a first semiconductor layer having a first conductive type at a semiconductor substrate through a first ion implantation of a first dopant;
    forming a second semiconductor layer having a second conductive type that is different from the first conductive type at a part of the first semiconductor layer through a second ion implantation of a second dopant by implanting the second dopant in the part of the first semiconductor layer; and
    performing thermal processing of the semiconductor substrate to activate at least one of the first and second dopants,
    wherein one of the first dopant or the second dopant is an n-type dopant, and an other one of the first dopant or the second dopant is a p-type dopant,
    the first semiconductor layer is in contact with the second semiconductor layer, and
    the forming of the second semiconductor layer comprises overlappingly implanting the second dopant into the part of the first semiconductor layer implanted with the first dopant, and inverting the conductive type of the part of the first semiconductor layer from the first conductive type to the second conductive type.

2. The method of claim 1, wherein the first dopant is implanted during the first ion implantation, and
    wherein the second dopant is implanted during the second ion implantation.

3. The method of claim 1, wherein forming the second semiconductor layer comprises implanting the second dopant of the second semiconductor layer in the part of the first semiconductor layer corresponding to an opening pattern of a mask.

4. The method of claim 1, further comprising implanting the second dopant of the second ion implantation deeper than the first dopant of the first ion implantation.

5. The method of claim 1, wherein an ion dose corresponding to the second ion implantation is higher than that corresponding to the first ion implantation.

6. The method of claim 1, wherein the performing of the thermal processing comprises exposing the semiconductor substrate to a temperature of about 950° C. to about 1100° C. in an atmosphere comprising at least one of nitrogen or oxygen.

7. The method of claim 1, wherein a junction depth of the second semiconductor layer is deeper than that of the first semiconductor layer after the thermal processing has been performed.

8. The method of claim 1, wherein a surface concentration of dopants of the second semiconductor layer is higher than that of the first semiconductor layer after the first and second ion implantations have been performed.

9. The method of claim 1, further comprising forming an anti-diffusion layer on the first and second semiconductor layers before the thermal processing is performed, and after the first ion implantation of the first dopant and the second ion implantation of the second dopant.

10. The method of claim 9, wherein forming the anti-diffusion layer comprises forming undoped silicate glass (USG).

11. The method of claim 1, further comprising forming a third semiconductor layer at a second surface of the semiconductor substrate through a third ion implantation, wherein the first and second ion implantations are performed at a first surface of the semiconductor substrate.

12. The method of claim 11, further comprising passivating the first and second surfaces of the semiconductor substrate after the third semiconductor layer has been formed.

13. The method of claim 12, wherein the passivating comprises an oxidation process for forming a silicon oxide layer at the first and second surfaces of the semiconductor substrate.

14. A method of manufacturing a photoelectric device, the method comprising:
    forming a first semiconductor layer at a first surface of a semiconductor substrate through a first ion implantation of a first dopant;
    forming a second semiconductor layer having a conductive type that is different from that of the first semiconductor layer at a part of the first semiconductor layer through a second ion implantation of a second dopant by implanting the second dopant in the part of the first semiconductor layer;
    forming a third semiconductor layer at a second surface of the semiconductor substrate that is opposite to the first surface through a third ion implantation; and
    performing thermal processing to correct lattice damage of the semiconductor substrate, to activate one of the first or second dopants, and to passivate the first and second surfaces of the semiconductor substrate,
    wherein one of the first dopant or second dopant is an n-type dopant, and an other one of the first dopant or second dopant is a p-type dopant,
    the first semiconductor layer is in contact with the second semiconductor layer, and
    the forming of the second semiconductor layer comprises overlappingly implanting the second dopant into the part of the first semiconductor layer implanted with the first dopant, and inverting the conductive type of the part of the first semiconductor layer from the first conductive type to the second conductive type.

15. The method of claim 14, wherein the performing of the thermal processing comprises forming a silicon oxide layer on the first and second surfaces of the semiconductor substrate.

16. The method of claim 14, wherein the performing of the thermal processing comprises performing a first processing and a second processing in a reactor containing the semiconductor substrate.

17. The method of claim 16, wherein the first processing comprises exposing the semiconductor substrate to a temperature of about 950° C. to about 1100° C., at a pressure of the reactor below about 0.5 torr in a nitrogen atmosphere for about 10 minutes to about 100 minutes, and
    wherein the second processing comprises forming an oxygen radical by supplying hydrogen and oxygen to the reactor together at a temperature of about 800° C. to about 1100° C. at a pressure of the reactor below about 0.5 torr.

18. The method of claim 16, wherein the first processing comprises exposing the semiconductor substrate to a temperature of about 950° C. to about 1100° C., at a pressure of the reactor above about 700 torr in a nitrogen atmosphere for about 10 minutes to about 100 minutes, and
    wherein the second processing comprises exposing the semiconductor substrate to a temperature of about 800°

C. to about 1100° C. in an oxygen atmosphere at a pressure of the reactor above about 700 torr.

19. The method of claim 18, wherein the second processing further comprises supplying a reaction gas containing at least one of hydrogen chloride or hydrogen to the reactor.

20. The method of claim 14, further comprising forming an anti-diffusion layer at the first surface of the semiconductor substrate after forming the first semiconductor layer and the second semiconductor layer, and before performing thermal processing.

21. The method of claim 20, wherein forming the anti-diffusion layer comprises forming undoped silicate glass (USG).

\* \* \* \* \*